(12) United States Patent
Xie et al.

(10) Patent No.: US 10,290,549 B2
(45) Date of Patent: May 14, 2019

(54) INTEGRATED CIRCUIT STRUCTURE, GATE ALL-AROUND INTEGRATED CIRCUIT STRUCTURE AND METHODS OF FORMING SAME

(71) Applicant: GLOBALFOUNDRIES INC., Grand Cayman (KY)

(72) Inventors: Ruilong Xie, Schenectady, NY (US); Julien Frougier, Albany, NY (US); Min Gyu Sung, Latham, NY (US); Edward Joseph Nowak, Shelburne, VT (US); Nigel G. Cave, Saratoga Springs, NY (US); Lars Liebmann, Mechanicville, NY (US); Daniel Chanemougame, Niskayuna, NY (US); Andreas Knorr, Saratoga Springs, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/695,229

(22) Filed: Sep. 5, 2017

(65) Prior Publication Data
US 2019/0074224 A1    Mar. 7, 2019

(51) Int. Cl.
*H01L 21/8238* (2006.01)
*H01L 27/092* (2006.01)
(Continued)

(52) U.S. Cl.
CPC ........... *H01L 21/823807* (2013.01); *H01L 21/823814* (2013.01); *H01L 21/823828* (2013.01);
(Continued)

(58) Field of Classification Search
CPC ....... H01L 21/823807; H01L 29/78696; H01L 21/823828; H01L 21/823878; H01L 29/66545; H01L 29/78618; H01L 21/823814; H01L 29/42392; H01L 29/0673; H01L 29/0649; H01L 27/092
See application file for complete search history.

(56) References Cited

U.S. PATENT DOCUMENTS 10,103,247 B1 * 10/2018 Xie ..................... H01L 29/4236
10,157,794 B1 * 12/2018 Suvarna .......... H01L 21/823418
(Continued)

*Primary Examiner* — Earl N Taylor
(74) *Attorney, Agent, or Firm* — Anthony Canale; Hoffman Warnick LLC

(57) ABSTRACT

The disclosure is directed to gate all-around integrated circuit structures, finFETs having a dielectric isolation, and methods of forming the same. The gate all-around integrated circuit structure may include a first insulator region within a substrate; a pair of remnant liner stubs disposed within the first insulator region; a second insulator region laterally adjacent to the first insulator region within the substrate; a pair of fins over the first insulator region, each fin in the pair of fins including an inner sidewall facing the inner sidewall of an adjacent fin in the pair of fins and an outer sidewall opposite the inner sidewall; and a gate structure substantially surrounding an axial portion of the pair of fins and at least partially disposed over the first and second insulator regions, wherein each remnant liner stub is substantially aligned with the inner sidewall of a respective fin of the pair of fins.

7 Claims, 37 Drawing Sheets

(51) Int. Cl.
    *H01L 29/06*       (2006.01)
    *H01L 29/423*     (2006.01)
    *H01L 29/786*     (2006.01)
    *H01L 29/66*       (2006.01)
    *H01L 27/11*       (2006.01)

(52) U.S. Cl.
    CPC .... *H01L 21/823878* (2013.01); *H01L 27/092* (2013.01); *H01L 29/0649* (2013.01); *H01L 29/0673* (2013.01); *H01L 29/42392* (2013.01); *H01L 29/66545* (2013.01); *H01L 29/78618* (2013.01); *H01L 29/78696* (2013.01); *H01L 27/1108* (2013.01)

(56) References Cited

U.S. PATENT DOCUMENTS

| | | | |
|---|---|---|---|
| 2011/0045648 A1* | 2/2011 | Knorr | H01L 21/76232 |
| | | | 438/296 |
| 2011/0254102 A1* | 10/2011 | Xiao | H01L 21/845 |
| | | | 257/369 |
| 2016/0190303 A1* | 6/2016 | Liu | H01L 29/66795 |
| | | | 257/192 |
| 2016/0284706 A1* | 9/2016 | Chung | H01L 27/0924 |
| 2017/0317084 A1* | 11/2017 | Cantoro | H01L 29/66795 |
| 2018/0019340 A1* | 1/2018 | Adusumilli | H01L 29/7851 |
| 2018/0082951 A1* | 3/2018 | Li | H01L 23/5283 |
| 2018/0158841 A1* | 6/2018 | Glass | H01L 21/845 |
| 2018/0166319 A1* | 6/2018 | Park | H01L 21/7682 |
| 2018/0166352 A1* | 6/2018 | Choi | H01L 21/762 |
| 2019/0013247 A1* | 1/2019 | Basker | H01L 29/6653 |

\* cited by examiner

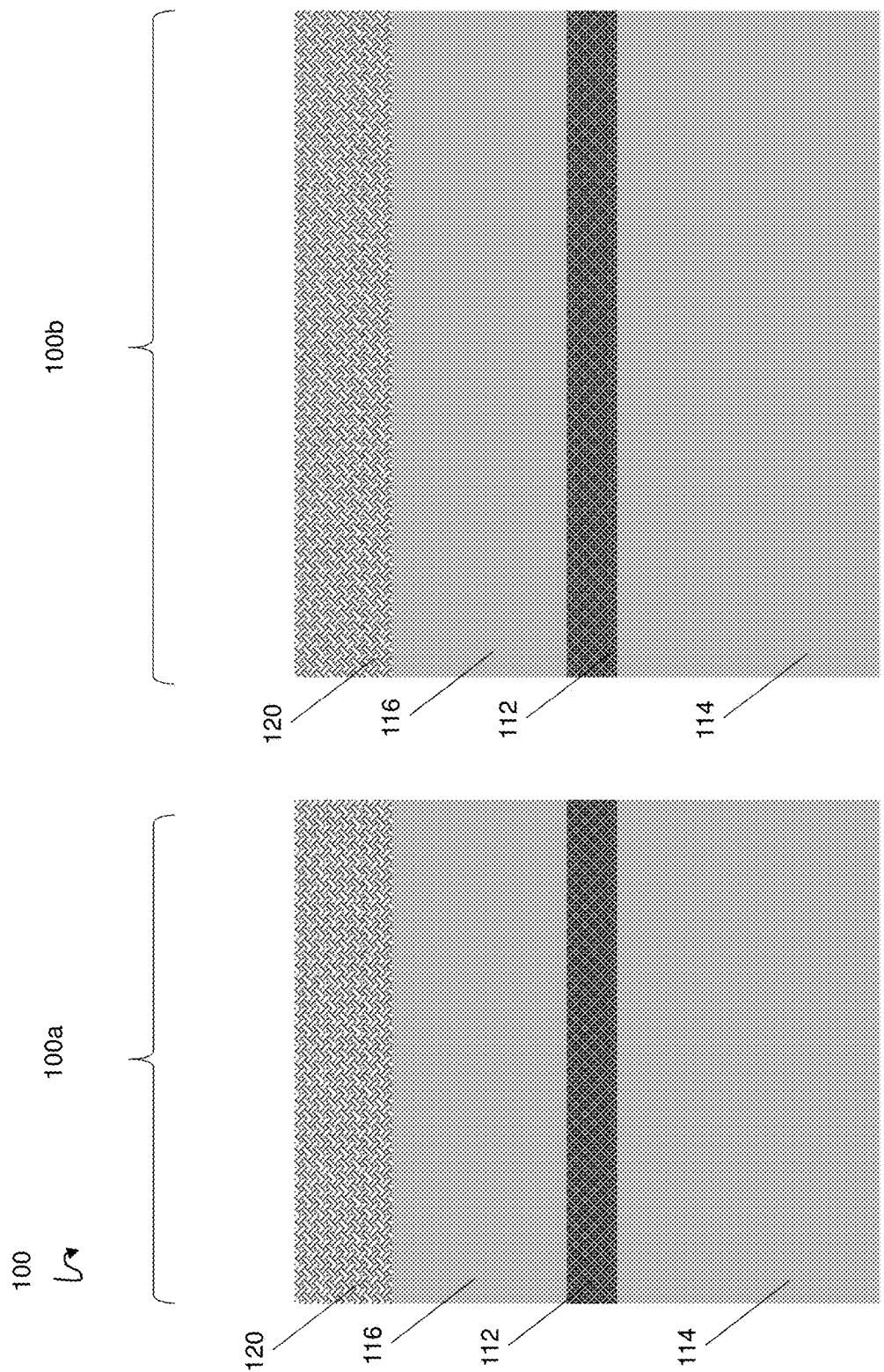

INTEGRATED CIRCUIT STRUCTURE, GATE ALL-AROUND INTEGRATED CIRCUIT STRUCTURE AND METHODS OF FORMING SAME

BACKGROUND

Technical Field

The present disclosure is directed to gate all-around integrated circuit structures, finFETs having a dielectric isolation, and methods of forming the same.

Related Art

In modern integrated circuits, such as microprocessors, storage devices and the like, a very large number of circuit elements, especially transistors, are provided and operated on a restricted chip area. In integrated circuits fabricated using metal-oxide-semiconductor (MOS) technology, field effect transistors (FETs) (with both n-type MOS (NMOS) and p-type MOS (PMOS) transistors) are provided that are typically operated in a switching mode. That is, these transistor devices exhibit a highly conductive state (on-state) and a high impedance state (off-state). FETs may take a variety of forms and configurations. For example, among other configurations, FETs may be either so-called planar FET devices or three-dimensional (3D) devices, such as finFET devices.

A FET, irrespective of whether an NMOS transistor or a PMOS transistor is considered, irrespective of whether it is a planar or 3D device, typically comprises doped source/drain regions that are formed in a semiconductor substrate that are separated by a channel region. A gate insulation layer is positioned above the channel region and a conductive gate electrode is positioned above the gate insulation layer. The gate insulation layer and the gate electrode together may sometimes be referred to as the gate stack structure for the device. By applying an appropriate voltage to the gate electrode, the channel region becomes conductive and current is allowed to flow from the source region to the drain region. In a planar FET device, the gate structure is formed above a substantially planar upper surface of the substrate. In some cases, one or more epitaxial growth processes are performed to form epitaxial (epi) semiconductor material in recesses formed in the source/drain regions of the planar FET device. In some cases, the epi material may be formed in the source/drain regions without forming any recesses in the substrate for a planar FET device, or the recesses may be overfilled, thus forming raised source/drain regions. The gate structures for such planar FET devices may be manufactured using so-called "gate-first" or "replacement gate" (gate-last) manufacturing techniques.

To improve the operating speed of FETs, and to increase the density of FETs on an integrated circuit, device designers have greatly reduced the physical size of FETs over the years. More specifically, the channel length of FETs can be scaled down significantly (i.e., channel length decreased), which can improve the switching speed of FETs. A number of challenges arise as feature sizes of FETs and integrated circuits get smaller. For example, significant downsizing of traditional planar FETs leads to electrostatic issues and electron mobility degradation. Scaled-down planar FETs have shorter gate lengths that make it more difficult to control the channel.

For 3D devices in the 7 nanometer and beyond realm, very small fin pitch is required and there may be variable pitches within the FETs. Such decreases in size may result in fin bending or fin reveal non-uniformity. For example, FIG. 1 shows a prior art IC structure 10 wherein fins 12 suffer from bending or collapsing. That is, fins 12 closest to each other may lean in towards each other. FIG. 2, shows a prior art IC structure 20 wherein the material 22, e.g., an insulator, which is disposed between adjacent fins is not uniformly etched to reveal fins 24 due to the differences in spacing between adjacent fins. For example, fins 24a and 24b are very close to each other with spacing less than 20 nm, and therefore it may be more difficult to etch material 22 therebetween than it is between fins 24b and 24c due to etch loading effort.

New device architectures such as "gate-all-around" nanowire or nanosheet structures allow further scaling of the integrated circuits, in part because the gate wraps around the channel and provides better control with lower leakage current, faster operations, improved electrostatic integration, and lower output resistance. A nanosheet transistor refers to a type of field-effect transistor (FET) that includes a plurality of stacked nanosheets extending between a pair of source/drain epitaxial regions. FETs typically include doped source/drain epitaxial regions that are formed in a semiconductor substrate and separated by a channel region. A gate insulation layer is positioned around the channel region and a conductive gate electrode is positioned around the gate insulation layer. The gate insulation layer and the gate electrode together may be referred to as the "gate stack," "gate structure," etc., for the device. By applying an appropriate voltage to the gate electrode, the channel region becomes conductive and current is allowed to flow between source regions and drain regions of the structure. While these nanosheet transistors are attractive options as scaling of integrated circuits continue, these types of transistors too suffer from their own problems. For example, nanosheet transistors or gate all-around structures suffer from parasitic channels that may compromise leakage or capacitance still. In addition, fabrication methods for these structures suffer from high costs and complicated fabrication schemes.

SUMMARY

A first aspect of the disclosure is directed to a gate all-around integrated circuit structure comprising: a first insulator region within a substrate; a pair of remnant liner stubs disposed within the first insulator region, wherein each remnant liner stub extends from a top surface of the first insulator region at least partially into the first insulator region; a second insulator region laterally adjacent to the first insulator region within the substrate, the second insulator region including an dielectric liner and an dielectric fill, the dielectric liner being interposed between the dielectric fill and the first insulator region; a pair of fins over the first insulator region, each fin in the pair of fins including an inner sidewall facing the inner sidewall of an adjacent fin in the pair of fins and an outer sidewall opposite the inner sidewall; and a gate structure substantially surrounding an axial portion of the pair of fins and at least partially disposed over the first and second insulator regions, wherein each remnant liner stub is substantially aligned with the inner sidewall of a respective fin of the pair of fins.

A second aspect of the disclosure is directed to a method. The method may include: providing a first semiconductor layer over a substrate and a second semiconductor layer over the first semiconductor layer; forming a set of pillars by forming a set of trenches extending within the substrate, the first semiconductor layer, and the second semiconductor layer, each pillar including a remaining portion of the substrate, the first semiconductor layer, and the second semiconductor layer; filling each trench in the set of trenches with a first insulator such that the first insulator is disposed between each pillar in the set of pillars; recessing the first insulator within each trench to a height below a height of a bottom surface of the first semiconductor layer of each pillar; forming a second insulator over the recessed first insulator within each trench to fill each trench; forming a pair of fins from each pillar in the set of pillars by forming an opening within each pillar to divide each pillar into the pair of fins, each fin including the first semiconductor layer, the second semiconductor layer, and at least a portion of the substrate, wherein each fin includes an inner sidewall facing the inner sidewall of an adjacent fin in the pair of fins and an outer sidewall immediately adjacent to the second insulator, the inner sidewalls of each fin in the pair of fins being separated from one another by the opening exposing the substrate therein; forming a liner within each opening along the inner sidewalls of each fin; selectively etching to remove the exposed portion of the substrate within each opening and to remove the substrate beneath the first semiconductor layer of each fin, such that each opening extends laterally beneath each fin in each pair of fins; filling each opening with a third insulator, the third insulator extending along the liner that is disposed along the inner sidewalls of each fin; removing the second insulator and recessing the third insulator such that the third insulator and the first insulator are substantially coplanar, and such that a first portion of the liner is exposed along the inner sidewalls of each fin and such that a second portion of liner extends within the third insulator; and removing the first portion of the liner to expose the inner sidewalls of each fin such that the second portion of the liner remains extending within the third insulator.

A third aspect of the disclosure is directed to a method for forming an integrated circuit structure. The method may include: providing a first semiconductor layer over a substrate and a second semiconductor layer over the first semiconductor layer; forming a set of pillars by forming a set of trenches extending within the substrate, the first semiconductor layer, and the second semiconductor layer, each pillar including a remaining portion of the substrate, the first semiconductor layer, and the second semiconductor layer; filling each trench in the set of trenches with a first insulator such that the first insulator is disposed between each pillar in the set of pillars; recessing the first insulator within each trench to a height below a height of a bottom surface of the first semiconductor layer of each pillar; forming a second insulator over the recessed first insulator within each trench to fill each trench; forming a pair of fins from each pillar in the set of pillars by forming an opening within each pillar to divide each pillar into the pair of fins, each fin including the first semiconductor layer, the second semiconductor layer, and at least a portion of the substrate, and wherein each fin includes an inner sidewall facing the inner sidewall of the adjacent fin in the pair of fins and an outer sidewall immediately adjacent to the second insulator, the inner sidewalls of each fin in the pair of fins being separated from one another by the opening exposing the substrate therein; removing the first semiconductor layer from each fin such that the second semiconductor layer is vertically spaced from the substrate, thereby laterally extending the opening that separates each fin in each pair of fins, each opening laterally extending between the substrate and the second semiconductor layer; conformally forming a liner within each opening and along the inner sidewalls of each fin; filling each opening with a third insulator, the third insulator extending along the liner that is disposed along the inner sidewalls of each fin; and recessing the second insulator and the third insulator such that the second insulator and the third insulator are substantially coplanar between each fin.

A fourth aspect of the disclosure is directed to an integrated circuit structure. The integrated circuit structure may comprise: a pair of fins over a substrate; a first insulator region interposed between each fin and the substrate, the first insulator region being substantially T-shaped such that the first insulator extends laterally from beneath one fin in the pair of fins to another fin in the pair of fins and such that the first insulator extends vertically at least partially within the substrate at a position between the one fin and the another fin; a gate structure over the insulator region and substantially surrounding each fin in the pair of fins; and source/drain epitaxial regions on opposing sides of the gate structure and laterally abutting each fin in the pair of fins.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein:

FIGS. 3-15 show cross-sectional views of an integrated circuit structure undergoing aspects of a method for forming fins according to an embodiment of the disclosure.

FIGS. 17-24 show cross-sectional views of the integrated circuit structure of FIG. 16 undergoing aspects of a method for forming a gate all-around integrated circuit structure according to an embodiment of the disclosure, wherein FIGS. 17, 20, 22 and 24 show a cross-sectional view of the integrated circuit structure taken along line A-A of FIG. 16, and FIGS. 18, 19, 21, and 23 show a cross-sectional view of the integrated circuit structure taken along line B-B of FIG. 16.

FIGS. 25-26 show cross-sectional views of a gate all-around integrated circuit structure according to another embodiment of the disclosure, wherein FIG. 25 shows a cross-sectional view of the integrated circuit structure taken along line A-A of FIG. 16, and FIG. 26 shows a cross-sectional view of the integrated circuit structure taken along line B-B of FIG. 16.

FIGS. 31-32 show cross-sectional views of a gate all-around integrated circuit structure according to the embodiment of FIGS. 27-30, wherein FIG. 31 shows a cross-sectional view of the integrated circuit structure taken along the gate, and FIG. 32 shows a cross-sectional view of the integrated circuit structure taken along a fin.

37-38 show cross-sectional views of a gate all-around integrated circuit structure according to the embodiment of FIGS. 33-36, wherein

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Figure 2:
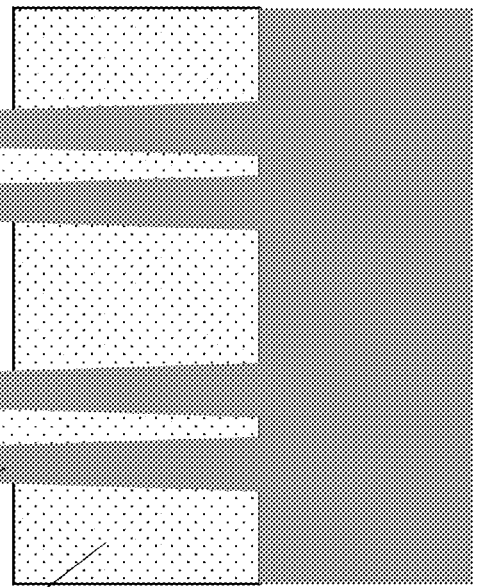
FIGS. 1-2 show cross-sectional views of prior art integrated circuit structures that suffer from bending or collapsing (FIG. 1), and fin reveal non-uniformity (FIG. 2).
Figure 1:
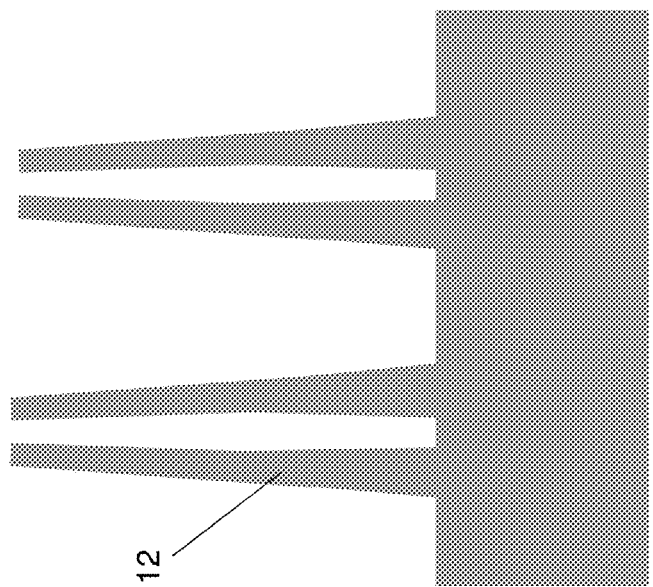

The disclosure is directed to gate all-around integrated circuit structures, finFETs having a dielectric isolation, and methods of forming the same. Aspects of the methods described herein provide for the fabrication of fins which do not suffer from bending or collapsing by providing insulators that line the fins and provide support for the fins during the fabrication process. In addition, aspects of the methods described herein ensure fin reveal uniformity during the fabrication process.

FIG. 3 shows a cross-sectional view of a preliminary integrated circuit (IC) structure 100 according to embodiments of the disclosure. IC structure 100 may include a first device region 100a in which a logic device may be formed. IC structure 100 may also include a second device region 100b in which a static random access memory (SRAM) device may be formed. Methods described herein are shown and applied equally to both an SRAM and a logic device.

Each device region 100a, 100b may include a first semiconductor layer 112 over a substrate 114, and a second semiconductor layer 116 over first semiconductor layer 112. Substrate 114 may include, e.g., a silicon substrate. Semiconductor layer 112 may include, e.g., silicon germanium, and semiconductor layer 116 may include, e.g., silicon. As will be described herein, semiconductor layer 112 may function as a sacrificial layer that is to be removed during fabrication of the resulting IC structure. In this way, substrate 114 and semiconductor layers 112, 116 may be considered a stack from which gate-all-around devices may be formed as will be described herein.

Substrate 114 and semiconductor layers 112, 116 may be formed by deposition of one layer on top of the other. As used herein, the term "depositing" may include any now known or later developed technique appropriate for deposition, including but not limited to, for example: chemical vapor deposition (CVD), low-pressure CVD (LPCVD), plasma-enhanced CVD (PECVD), semi-atmosphere CVD (SACVD) high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and evaporation.

Figure 4:
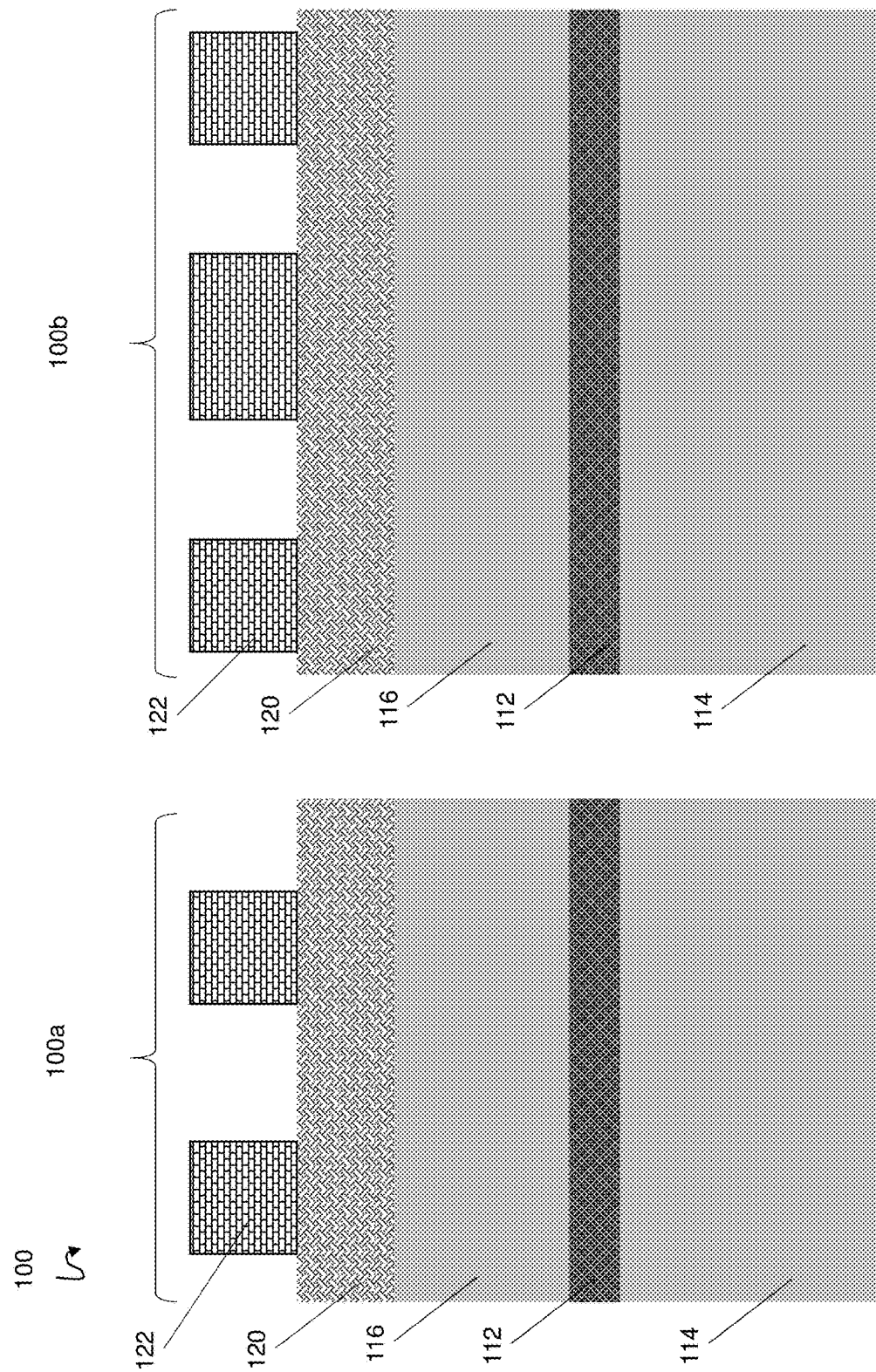
Figure 5:
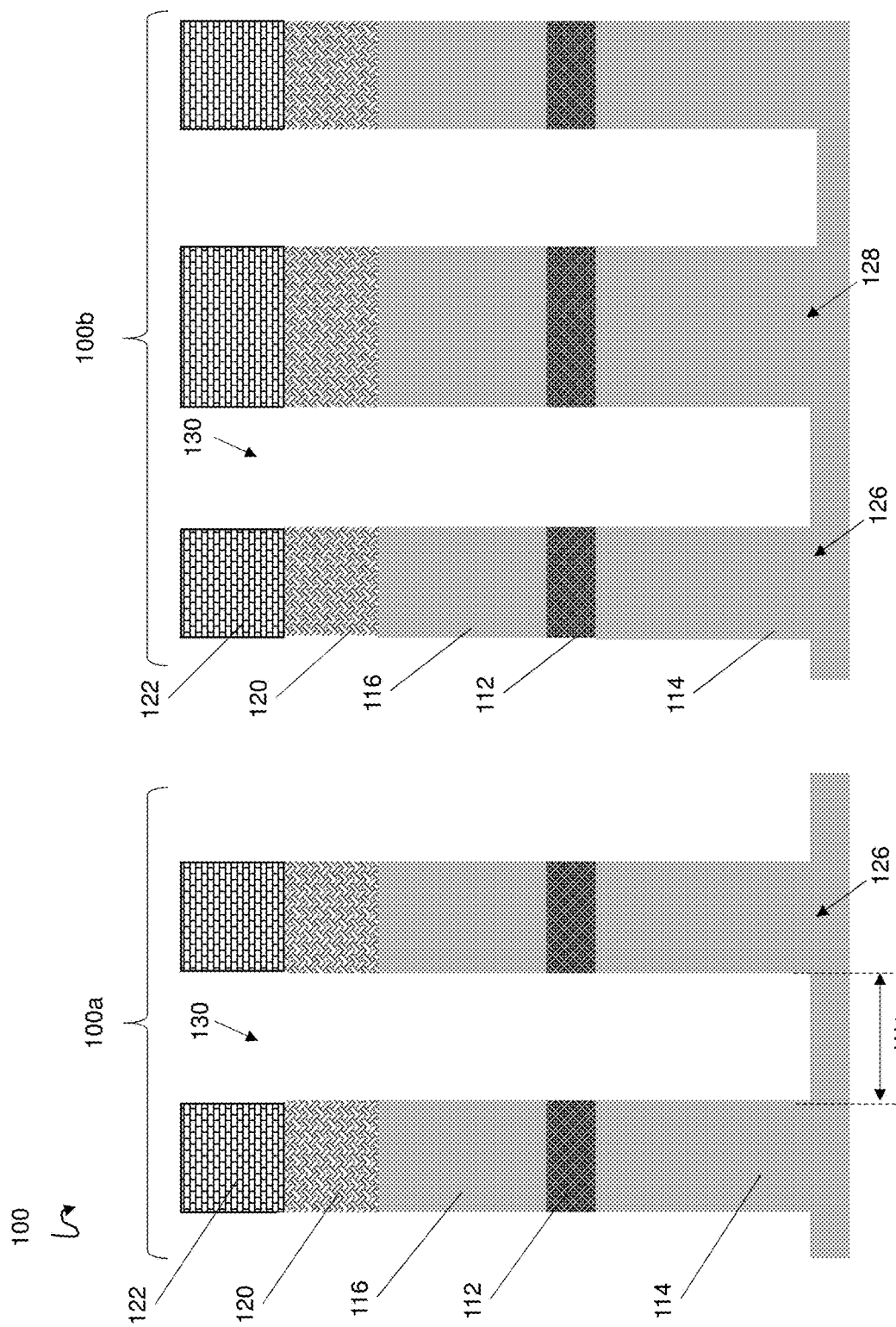

Further, a mask 120 may be formed over semiconductor layer 116. Mask 120 may include a single layer or combination of layers formed from, e.g., silicon nitride, or any other hard mask material known in the art. Turning now to FIG. 4, a mandrel 122 may be formed over mask 120. Mandrel 122 may be used as a sacrificial structure for patterning substrate 114 and semiconductor layers 112, 116, and hardmask 120. Mandrel 122 may include any sacrificial material known in the art for patterning such material such as, e.g., organic planarizing layer (OPL) or amorphous carbon (a-C). As seen in FIG. 5, mandrel 122 may be used to form a set of trenches 130 to define a set of pillars 126.

More specifically, the methods according to the disclosure may continue with forming a set of pillars 126 from substrate 114 and semiconductor layers 112, 116 by forming a set of trenches 130 through semiconductor layers 112, 116 and extending into at least an upper portion of substrate 114 as shown in FIG. 5. Trenches 130 may be formed by etching portions of mask 120, substrate 114, and semiconductor layers 112, 116 that are not covered by mandrels 122. As a result of the formation of trenches 130, pillars 126 may be defined, and trenches 130 may substantially surround pillars 126. Each pillar 126 may include a remaining portion of substrate 114 and semiconductor layers 112, 116, and hardmask 120. The width of pillar 126 may range from approximately 20 nanometers (nm) to approximately 42 nm, and width W1 of trenches 130 between pillars 126 may be approximately 30 nm to approximately 100 nm. However, it may also be desirable to form a pillar 128 larger than remaining pillars 126 which may later be used to separate devices as will be described herein.

As used herein, "etching" generally refers to the removal of material from a substrate or structures formed on the substrate by wet or dry chemical means. In some instances, it may be desirable to selectively remove material from certain areas of the substrate. In such an instance, a mask may be used to prevent the removal of material from certain areas of the substrate. There are generally two categories of etching, (i) wet etch and (ii) dry etch. Wet etching may be used to selectively dissolve a given material and leave another material relatively intact. Wet etching is typically performed with a solvent, such as an acid. Dry etching may be performed using a plasma which may produce energetic free radicals, or species neutrally charged, that react or impinge at the surface of the wafer. Neutral particles may attack the wafer from all angles, and thus, this process is isotropic. Ion milling, or sputter etching, bombards the wafer with energetic ions of noble gases from a single direction, and thus, this process is highly anisotropic. A reactive-ion etch (RIE) operates under conditions intermediate between sputter etching and plasma etching and may be used to produce deep, narrow features, such as trenches 130.

Figure 6:
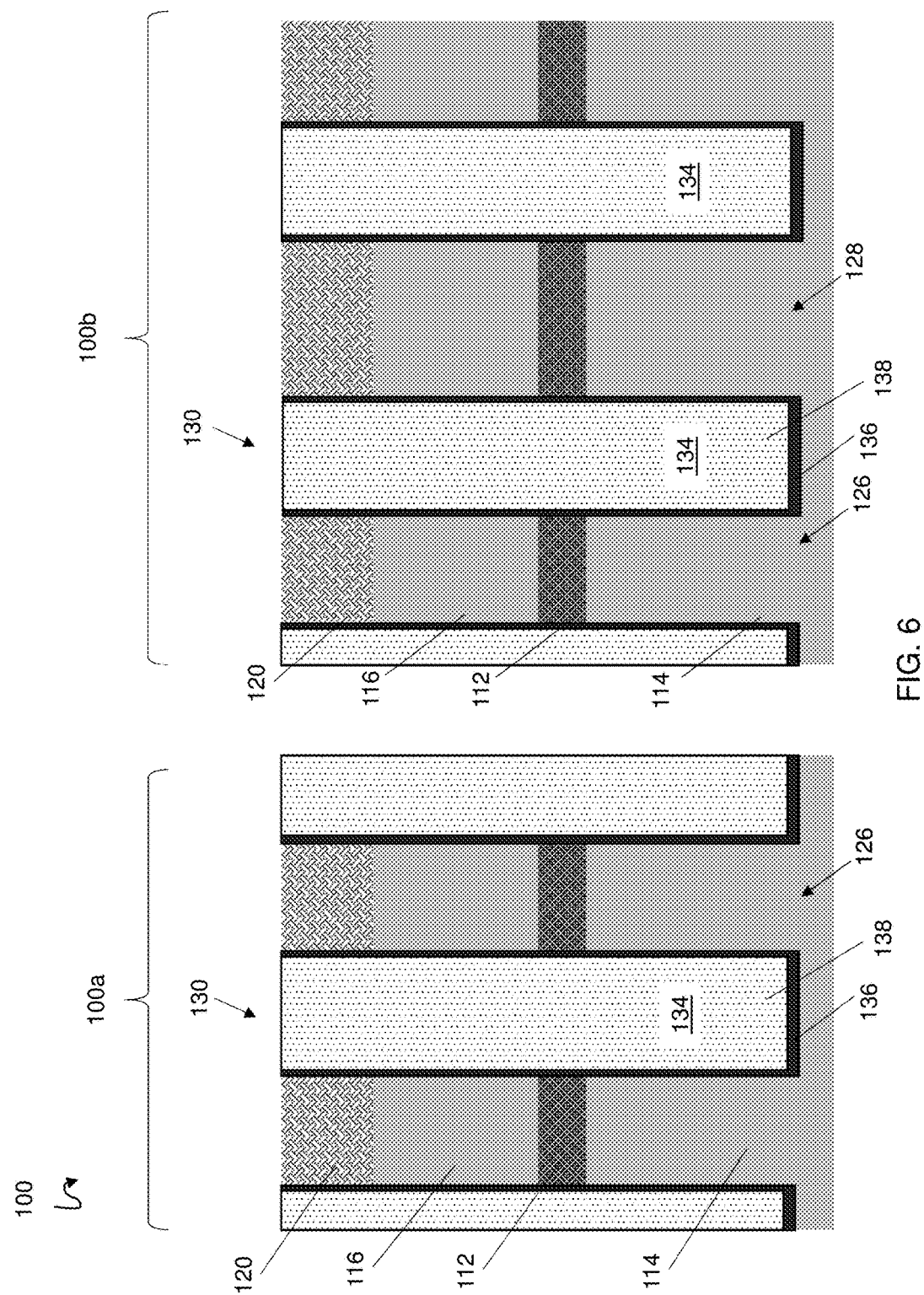

Turning now to FIG. 6, mandrels 122 may be removed and each trench 130 may be filled with an insulator 134 such that insulator 134 substantially surrounds set of pillars 126, 128, or is disposed between adjacent pillars 126, 128. Insulator 134 may include a dielectric liner 136, e.g., silicon nitride, and a dielectric fill 138, e.g., silicon oxide. Insulator 134 may be formed by deposition of dielectric liner 136 along sidewalls and a bottom surface of trenches 130. Dielectric fill 138 may be deposited over dielectric liner 136 to substantially fill each trench 130. Insulator 134 may be planarized to a top surface of mask 120.

Figure 7:
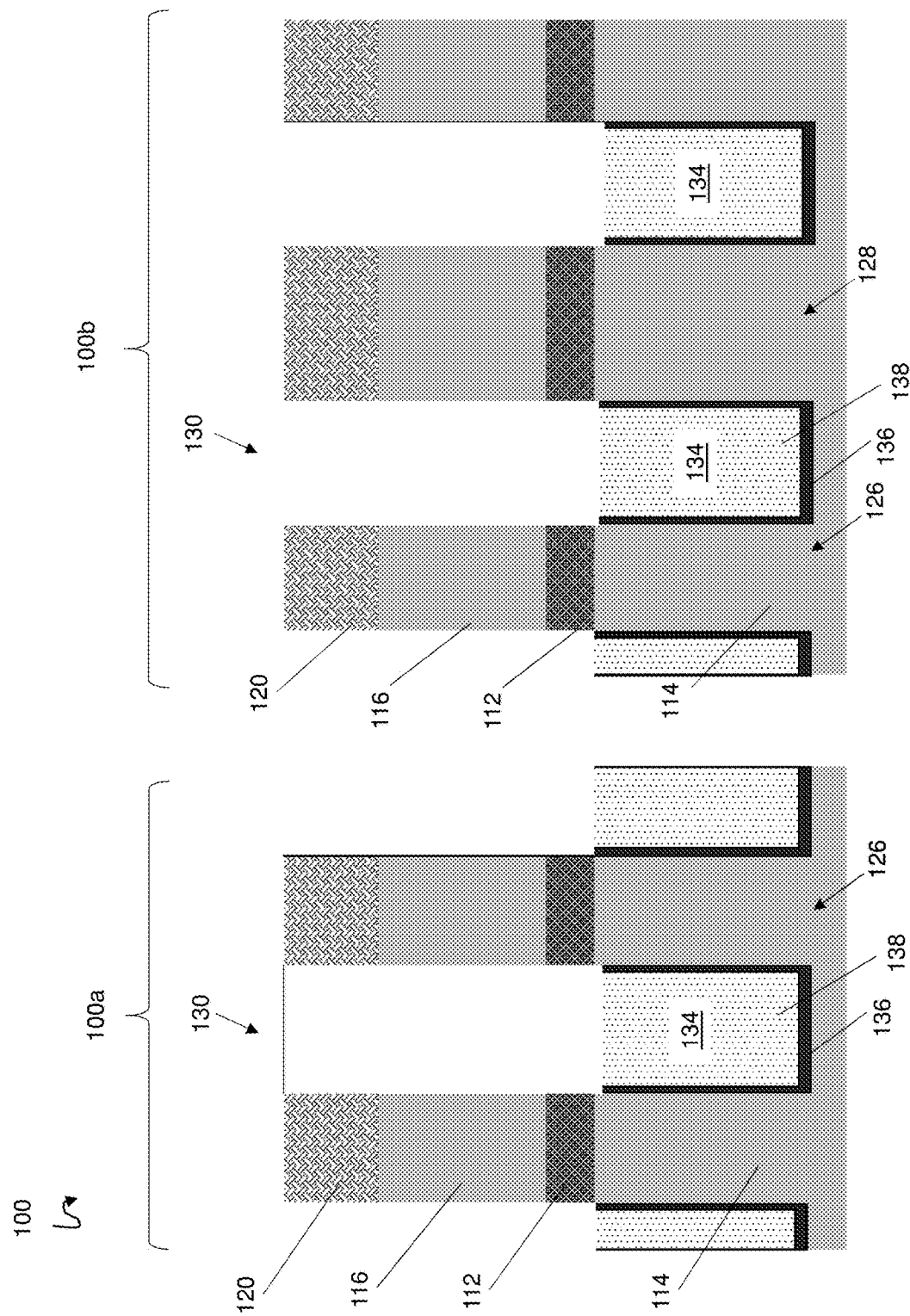
Figure 8:
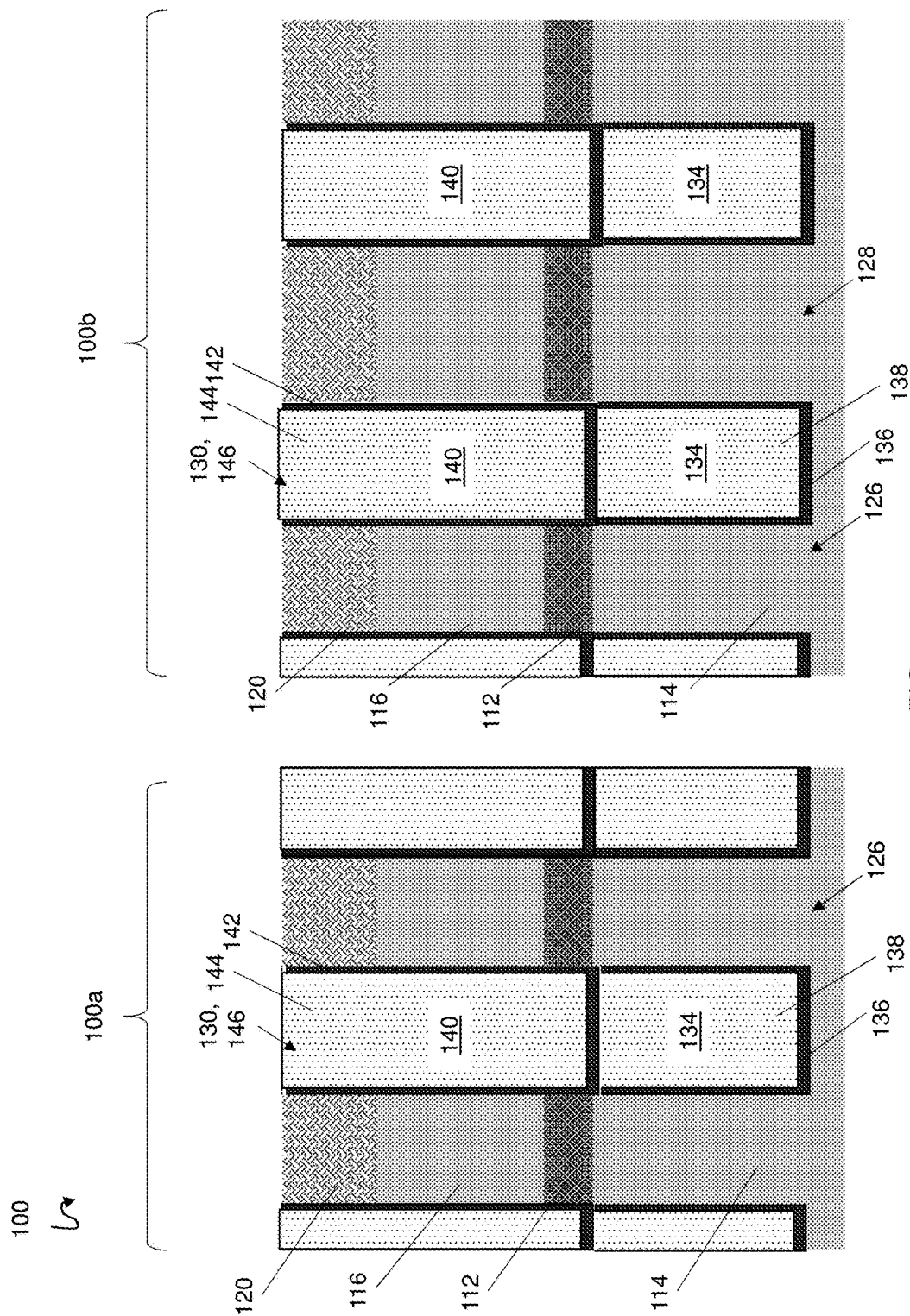

As shown in FIG. 7, insulator 134 within each trench 130 may be recessed, e.g., via etching, to a height below a height of each pillar 126, 128, or more specifically to a height below the top surface of semiconductor layer 112. For example, insulator 134 may be recessed to approximately an interface of the top surface of substrate 114 and the bottom surface of semiconductor layer 112. In other embodiments, insulator 134 may be recessed to below the interface of the top surface of substrate 114 and the bottom surface of semiconductor layer 112. Since the width W1 (FIG. 5) of each trench 130 between pillars 126, 128 are similar and not extremely small (e.g., greater than or equal to 30 nanometers), the recess uniformity may be easily controlled. Further, another insulator 140 may be formed, e.g., via deposition, over the recessed insulator 134 within each trench 130 to fill each trench 130 as shown in FIG. 8. Insulator 140 may include a dielectric liner 142 and a dielectric fill 144. Dielectric liner 142 and dielectric fill 144 may include any material discussed relative to dielectric liner 136 and dielectric fill 138, respectively. Insulator 134 and insulator 140 may together be considered a single insulator region 146 composed of an upper portion having dielectric fill 144 and a bottom portion including dielectric fill 138. The upper portion of insulator region 146 including dielectric fill 144 may be separated from the bottom portion including dielectric fill 138 by liner 142. As shown, liner 142 may be disposed proximate an interface of a bottom surface of first semiconductor layer 112 and a top surface of substrate 114. In some embodiments, dielectric liner 142 may be disposed below the interface of the bottom surface of first semiconductor layer 112 and the top surface of substrate 114.

Figure 9:
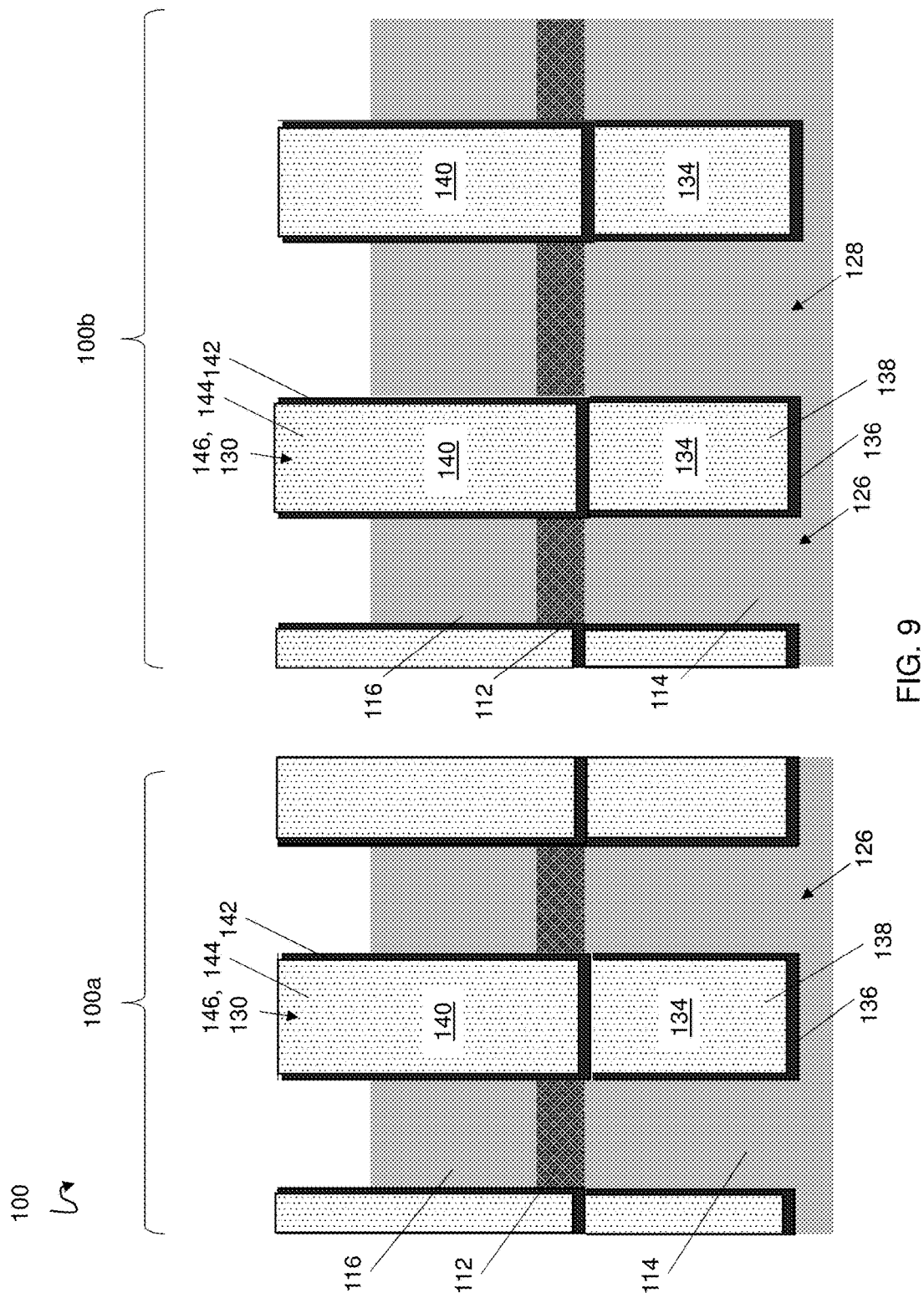
Figure 10:
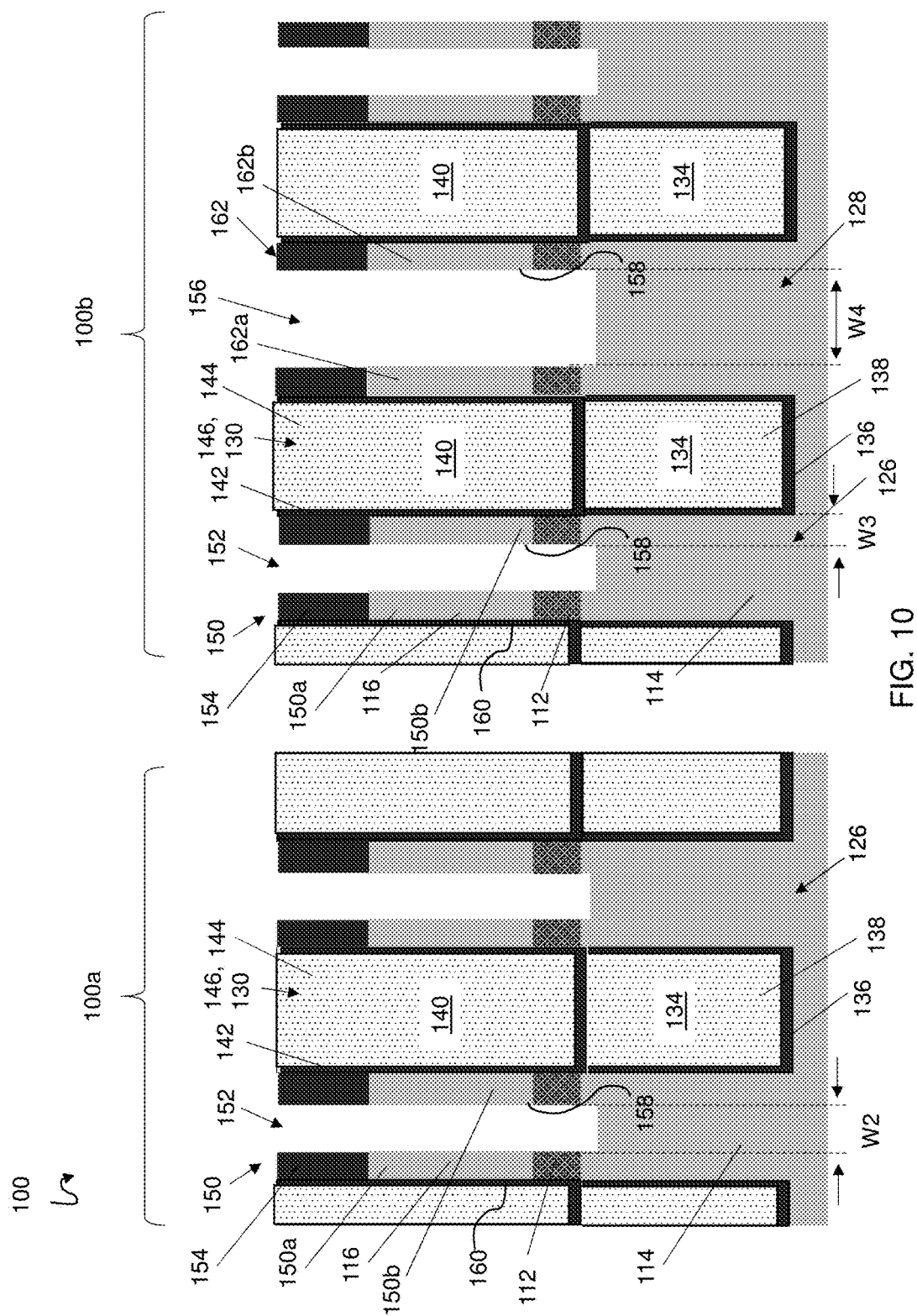

Turning now to FIG. 9, mask 120 may be removed from each pillar 126, 128 to expose semiconductor layer 116 thereunder. At this point, insulator 140 may extend beyond a top surface of pillars 126, 128. Subsequently, a pair of fins 150, 162 may be formed from each pillar 126 by forming an opening 152, 156 within each pillar 126, 128 to divide each pillar 126, 128 into pair of fins 150, 162 as shown in FIG. 10. More specifically, an inner spacer 154 may be formed, e.g., by a conformal deposition followed by anisotropic etching, over each pillar 126, 128 and an opening 152, 156 may be formed, e.g., via etching, within spacer 154 and pillars 126, 128 to form opening 152, 156 therein to divide each pillar 126, 128 into pair of fins 150, 162 having spacers 154 thereover. Spacers 154 may include, e.g., silicon nitride. Each fin 150a, 150b, 162a, 162b in pair of fins 150, 162 may include remaining portions of semiconductor layers 112, 116 and at least a portion of substrate 114. That is, openings 152, 156 may be etched such that openings 152, 156 at least partially extend into substrate 114 below semiconductor layer 112. Each fin 150a, 150b, 162a, 162b in each pair of fins 150, 162 may include opposing inner sidewalls 158 and respective outer sidewalls 160 being supported by insulator region 146. More specifically, each fin 150a, 150b, 162a, 162b may include inner sidewall 158 facing inner sidewall 158 of an adjacent fin 150a, 150b, 162a, 162b in pair of fins 150, 162 and outer sidewall 160 immediately adjacent to insulator 140. Inner sidewalls 158 of each fin 150a, 150b, 162a, 162b in each pair of fins 150, 162 may be separated from one another by opening 152, 156 exposing substrate 114 therein. The pitch or distance between each fin 150a, 150b within each pair of fins 150 may be approximately less than 30 nanometers, or more particularly, approximately 14 nanometers to approximately 20 nanometers. That is, opening 152 may have a width W2 of approximately less than 30 nanometers, or more particularly, approximately 14 nanometers to approximately 20 nanometers. The critical dimension or width W3 of each fin 150a, 150b within each pair of fins 150 may be approximately less than 8 nanometers, or more particularly approximately 4 nanometers to approximately 6 nanometers. However, opening 156 may be formed within larger pillar 128 to form pair of fins 162. Opening 156 may have a width W4 that is larger than width W2 of openings 152, e.g., width W4 may be approximately equal to 30 nanometers or greater. Opening 156 may be used to separate devices, e.g., separate fin 162a from fin 162b of pair of fins 162, as will be described herein. In contrast to conventional IC structures, fins 150a, 150b, 162a, 162b of IC structure 100 do not suffer from bending or collapsing due to being supported by insulator 140 and spacers 154.

Figure 11:
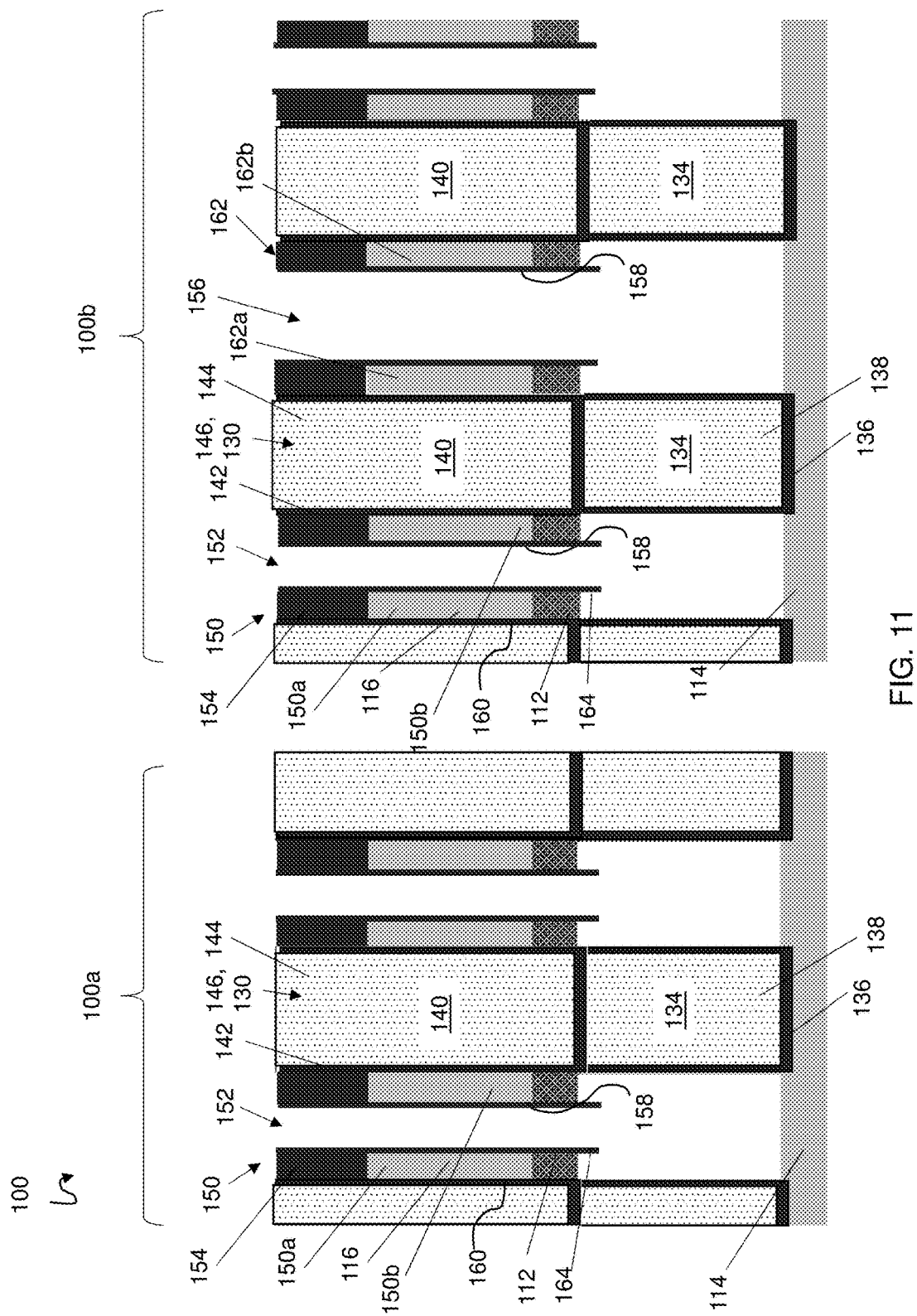

As shown in FIG. 11, a liner 164 may be formed within each opening 152, 156 along inner sidewalls 158 of each fin 150a, 150b, 162a, 162b in pair of fins 150, 162. Liner 164 may include, e.g., silicon nitride. Further, the exposed portion of substrate 114 within each opening 152, 156 may be selectively etched, e.g., by selective silicon isotropic etching, such that portions of substrate 114 exposed by each opening 152, 156 beneath fins 150a, 150b, 162a, 162b are removed or etched away. That is, portions of substrate 114 beneath semiconductor layer 112 are removed and openings 152, 156 are expanded into substrate 114 and laterally beneath semiconductor layer 112 such that openings 152, 156 extend between insulators 134 that are disposed on opposing sides of each pair of fins 150, 162. Liner 164 may provide further support and protection of fins 150a, 150b, 162a, 162b in each pair of fins 150, 162 during this etching of substrate 114.

Figure 12:
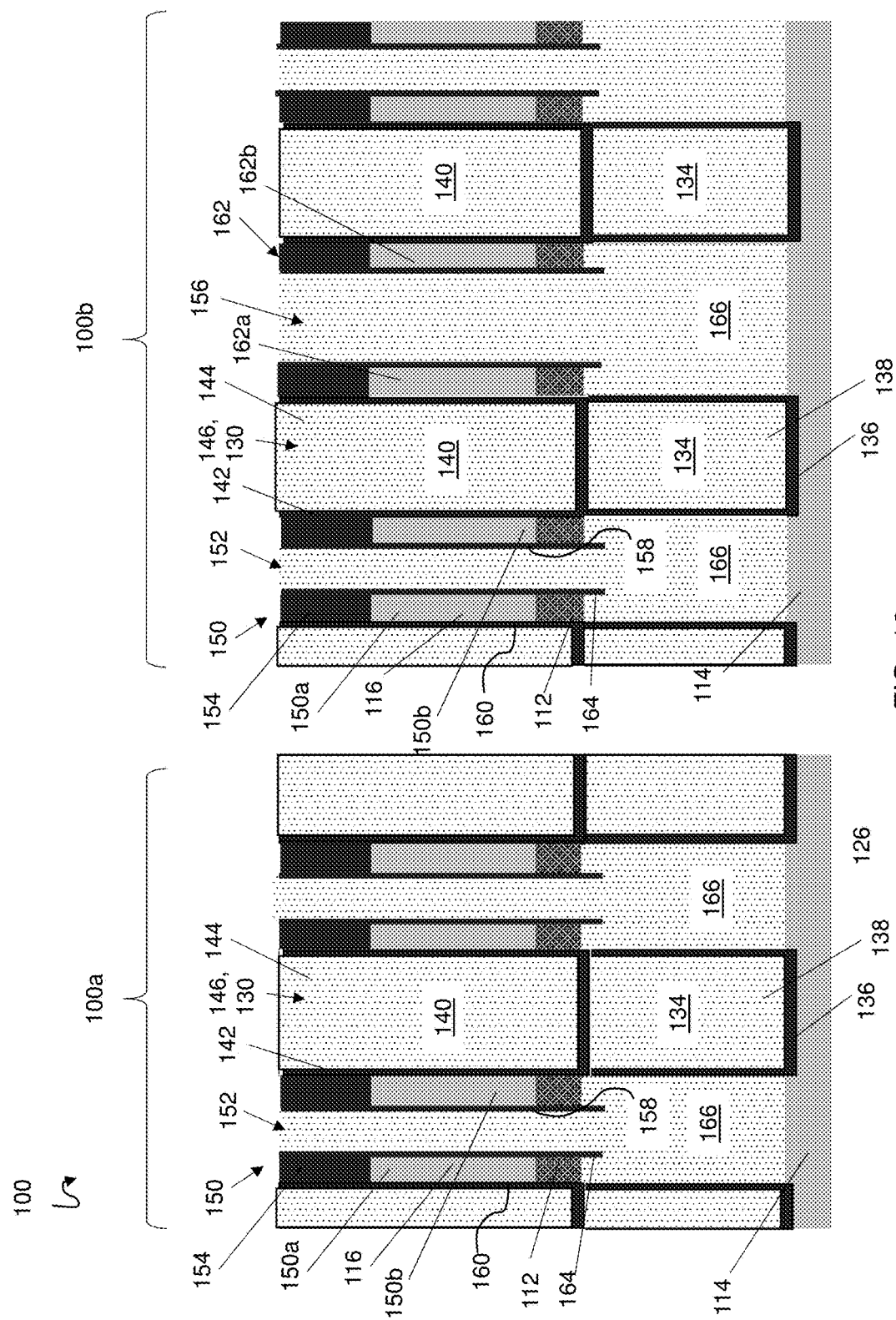

Turning now to FIG. 12, each opening 152, 156 may be filled, e.g., via deposition, with another insulator 166. Insulator 166 may include a dielectric fill material that may be the same as dielectric fills 138, 144. Insulator 166 may fill at least opening 152, 156 beneath each fin 150a, 150b, 162a, 162b. Insulator 166 may extend along liner 164 that is disposed along the inner sidewalls 158 of each fin 150a, 150b, 162a, 1628b. Additionally, insulator 166 may extend laterally between insulators 134 beneath fins 150a, 150b, 162a, 162b of each pair of fins 150, 162.

Figure 13:
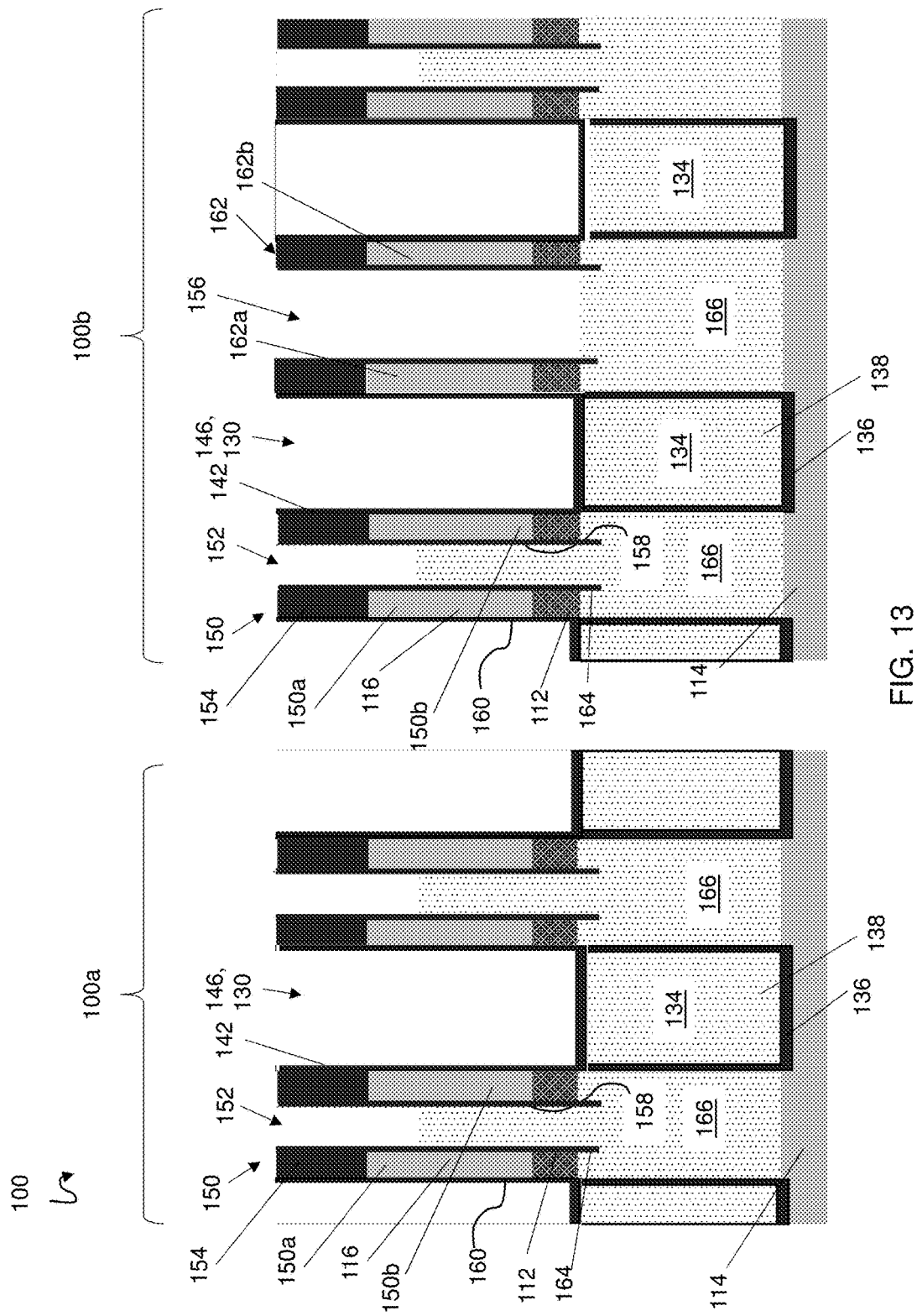

As shown in FIG. 13, the method may continue by performing an etch to remove a portion of insulator region 146. More specifically, an etch may be performed to remove the upper portion of insulator 146 including dielectric fill 144 (FIG. 12) from between adjacent pairs of fins 150, 162. This etching may also remove portions of insulator 166 within openings 152. However, since the pitch is tighter or smaller between fins 150a, 150b within a single pair of fins 150 than it is between adjacent pairs of fins 150 where dielectric fill 144 is disposed, less of insulator 166 may be recessed as compared to the amount of dielectric fill 144 that is removed during this etching. Further, since width W4 (FIG. 10) of opening 156 is greater than width W2 (FIG. 10) of opening 152, insulator 166 therein may also be etched during this etching step. That is, by virtue of dielectric fill 144 between adjacent pairs of fins 150, 162 and insulator 166 between fins 162a, 162b being disposed within a space that is larger than the area in which insulator 166 is disposed within openings 152, dielectric fill 144 and insulator 166 in those areas may be etched at a faster rate than insulator 166 within openings 152. As a result, the amounts of dielectric fill 144 and insulator 166 that may be removed during this etching may not be uniform or equal. In some embodiments (shown in FIG. 13), dielectric fill 144 may be entirely removed to expose liner 142 thereunder.

Figure 14:
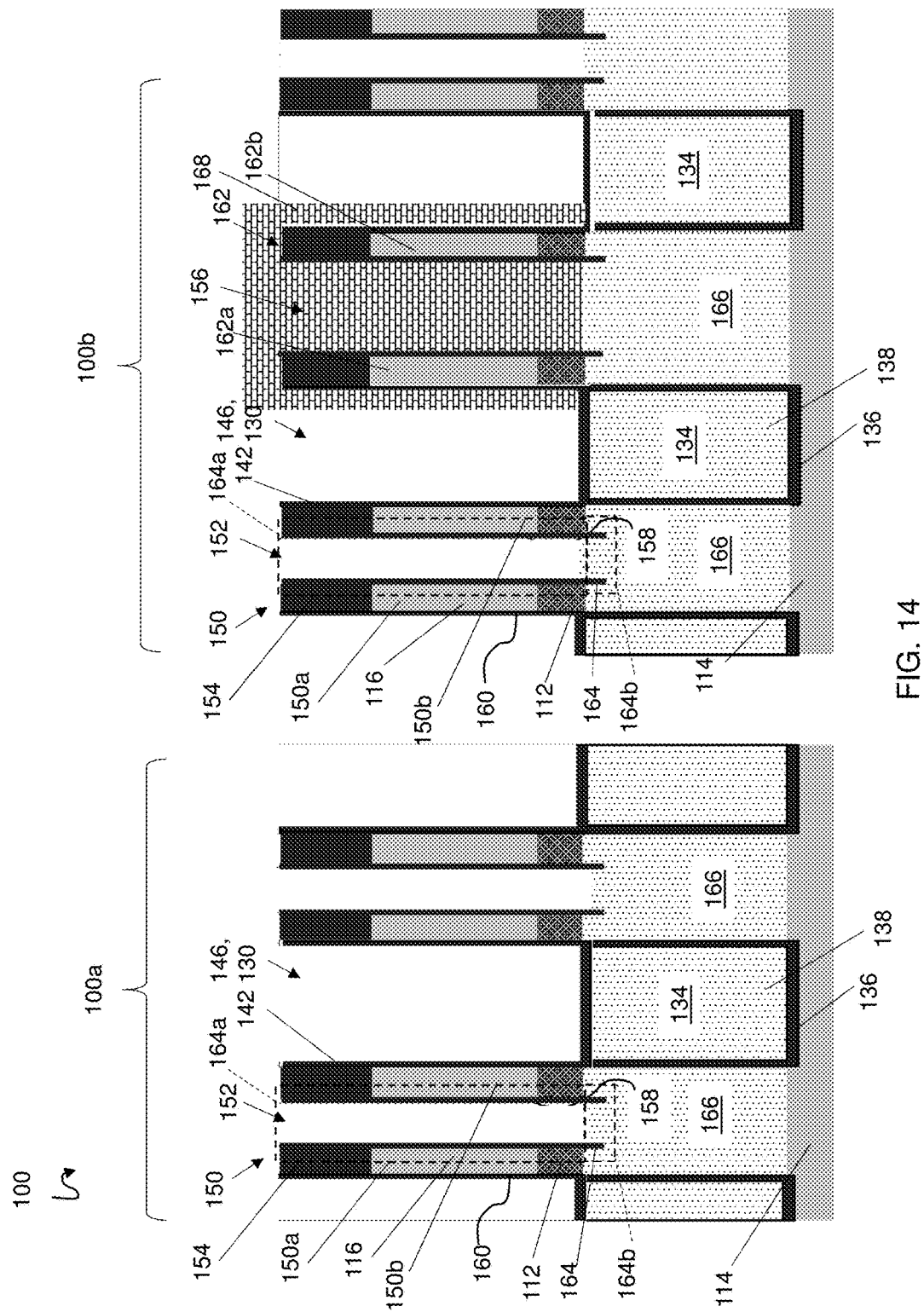

In order to ensure fin reveal uniformity, a second etching may be performed to remove portions of insulator 166 until the amount of any insulator between fins 150a, 150b, 162a, 162b within a single pair of fins 150, 162 is approximately coplanar with any insulator that is disposed between adjacent pairs of fins 150 as shown in FIG. 14. In some cases it may be necessary to use an optional mask 168 to protect insulator 166 beneath pair of fins 162 from being further etched within opening 156. Since opening 156 is larger than openings 152, insulator 166 may already be planar with insulator 134 as a result of the etch process described relative to FIG. 13. However, no mask is needed to protect insulator 134 from being further etched between adjacent pairs of fins 150 since liner 142 remains. Dielectric liner 142 protects insulator 134 thereunder from being further etched. As a result of this etching, liner 164 that extends along inner sidewalls 158 of fins 150a, 150b, 162a, 162b within pair of fins 150, 162 may be exposed. At this point, liner 164 may have a first portion 164a (i.e., portion of liner 164 within dotted box 164a) that is defined by the portion of liner 164 that is in direct contact with inner sidewalls 158 of fins 150a, 150b, 162a, 162b within pair of fins 150, 162. Further, liner 164 may have a second portion 164b (i.e., portion of liner 164 within dotted box 164b) that is defined by an extension of liner 164 that extends from fins 150a, 150b, 162a, 162b within the remaining portion of insulator 166 after etching of insulator 166.

Figure 15:
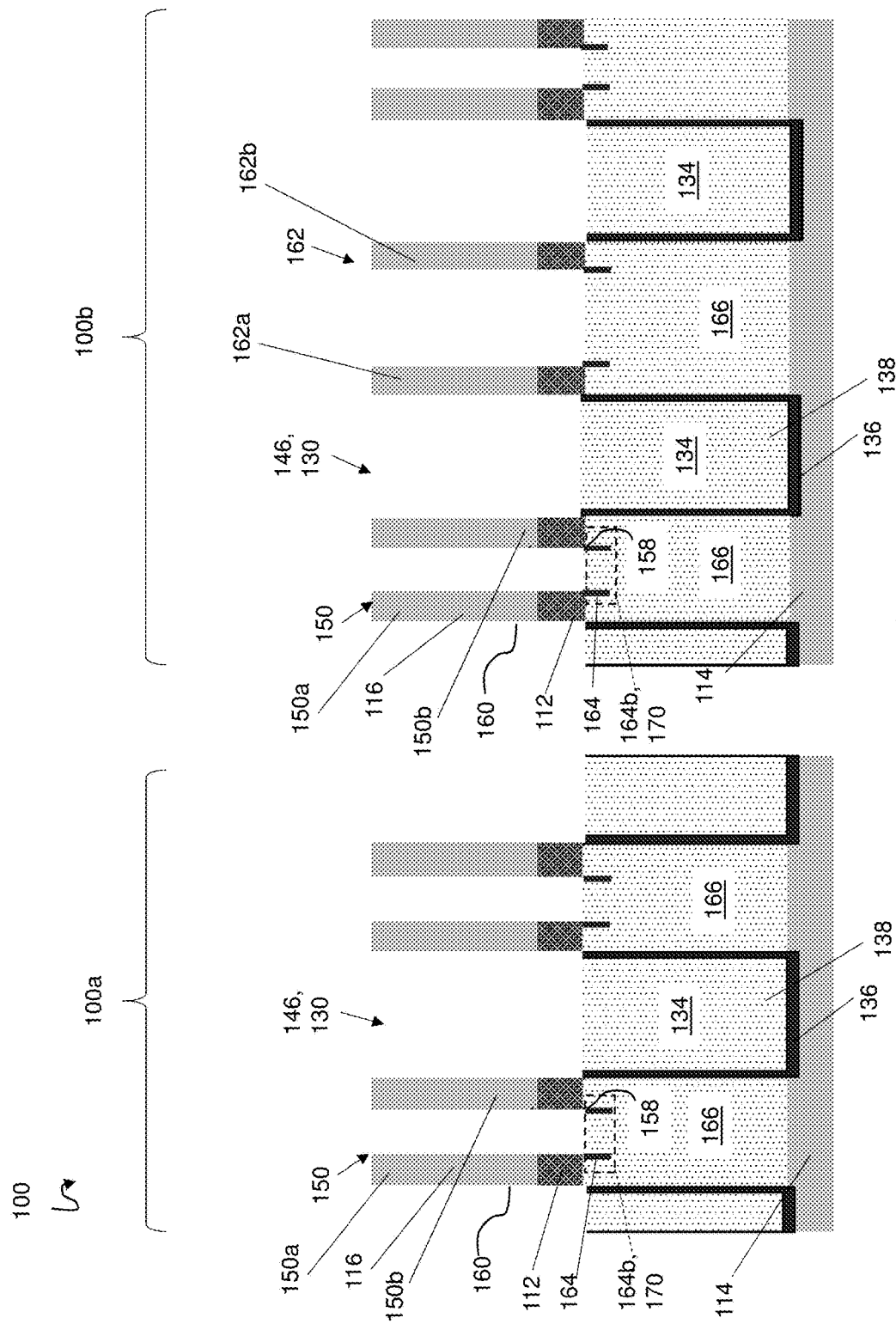

Turning now to FIG. 15, the method may continue with removing portion 164a (FIG. 14) of liner 164 to expose inner sidewalls 158 of each fin 150, 150b, 162a, 162b within each pair of fins 150, 162 such that portion 164b of liner 164 remains extending within remaining portions of insulator 166. As a result, a pair of remnant liner stubs 170 remain within insulator 166. Each remnant liner stub of the pair 170 extends from a top surface of insulator 166 at least partially into insulator 166. Each remnant liner stub 170 may be aligned with an inner sidewall 158 of a respective fin 150a, 150b, 162a, 162b within each pair of fins 150, 162. During this etching, spacers 154 (FIG. 14) that are disposed over each fin 150a, 150b, 162a, 162b, and liner 142 that is disposed along outer sidewalls 160 of each fin 150a, 150b, 162a, 162b may also be removed. In addition, exposed portions of liner 142 that is disposed on insulator 134 between adjacent pairs of fins 150, 162 may also be removed. That is, since liner 164, dielectric liner 142, and spacers 154 may each be of the same material, e.g., silicon nitride, exposed portions of these features may be removed during this etch process. As a result, semiconductor layer 116 of fins 150a, 150b, 162a, 162b, including inner sidewalls 158 and outer sidewalls 160 thereof, may be exposed as shown in FIG. 15. In addition, insulator 134 that is disposed between adjacent pairs of fins 150, 162, remaining portions of insulator 166, and portion 164b of liner 164 may also be exposed, i.e., remnant fins 170.

The method thus far results in fins 150a, 150b that do not suffer from bending and collapsing that fins of conventional FINFETS and gate all-around integrated circuit devices do. In addition, any insulator, e.g., insulator 166, that is disposed between fins 150a, 150b, 162a, 162b within pair of fins 150, 162 is substantially coplanar with any insulator, e.g., insulator 134, that is disposed between adjacent pairs of fins 150, 162 even though there may be a tighter pitch between fins 150a, 162a and fins 150b, 162b within a single pair of fins 150, 162 than there is between adjacent pairs of fins 150, 162. That is, there is substantially uniform reveal of each fin 150a, 150b, 162a, 162b.

Figure 16:
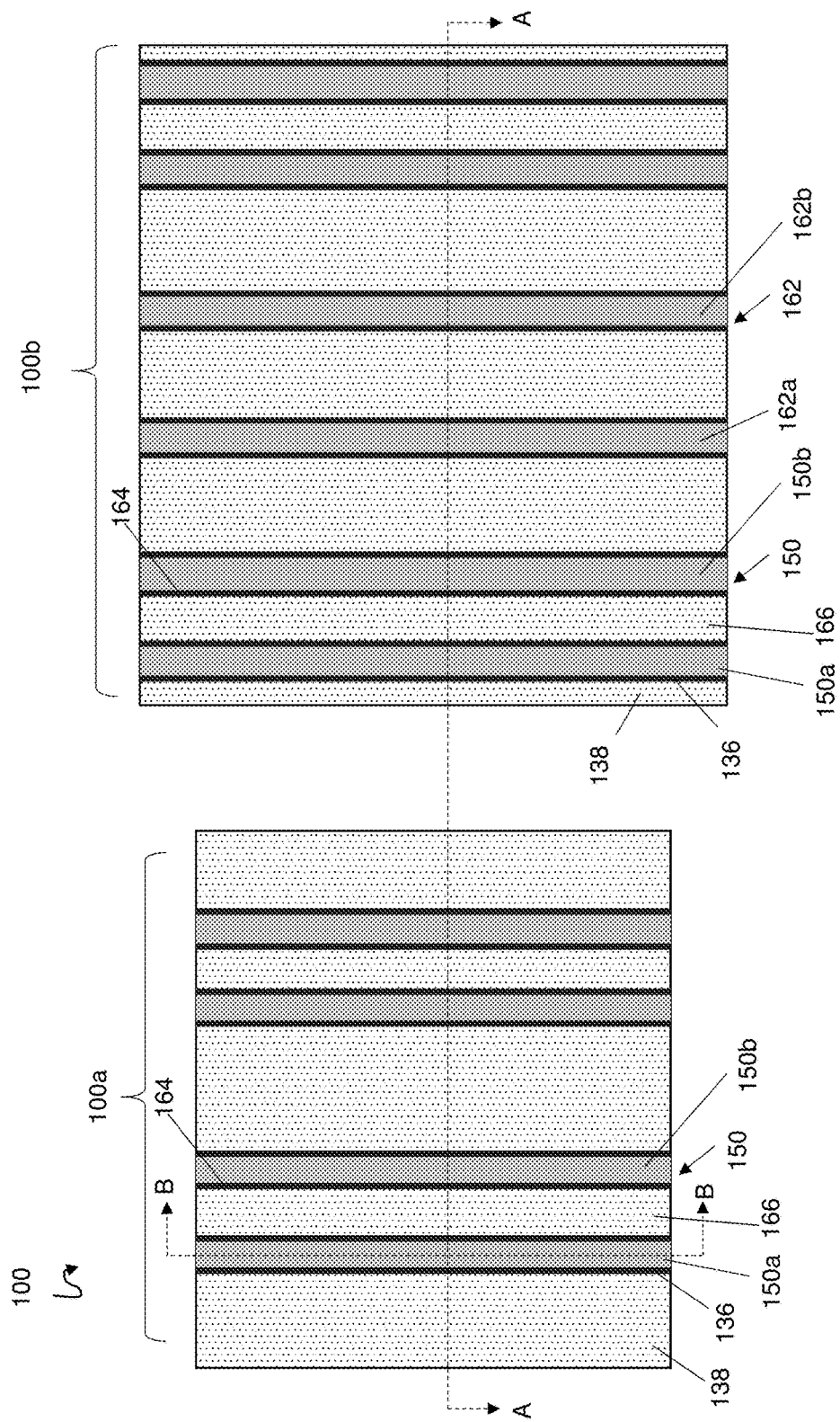
FIG. 16 shows a top down view of the integrated circuit structure of FIG. 15.

Turning now to FIGS. 16-24, the method may continue with forming an active gate structure to define a resulting gate all-around integrated circuit device according to the disclosure. FIG. 16 shows a top-down view of IC structure 100 according to FIG. 15. Thus far, FIGS. 3-15 have shown the cross-sectional view of IC structure 100 taken along line A-A as it has been undergoing aspects of the methods described herein. FIGS. 17, 20, 22, and 24 show the cross-sectional view of IC structure 100 taken along line A-A as the active gate structure is being formed. FIGS. 18, 19, 21, and 23 show a cross-sectional view of IC structure 100 taken along line B-B as the active gate structure is being formed.

Figure 17:
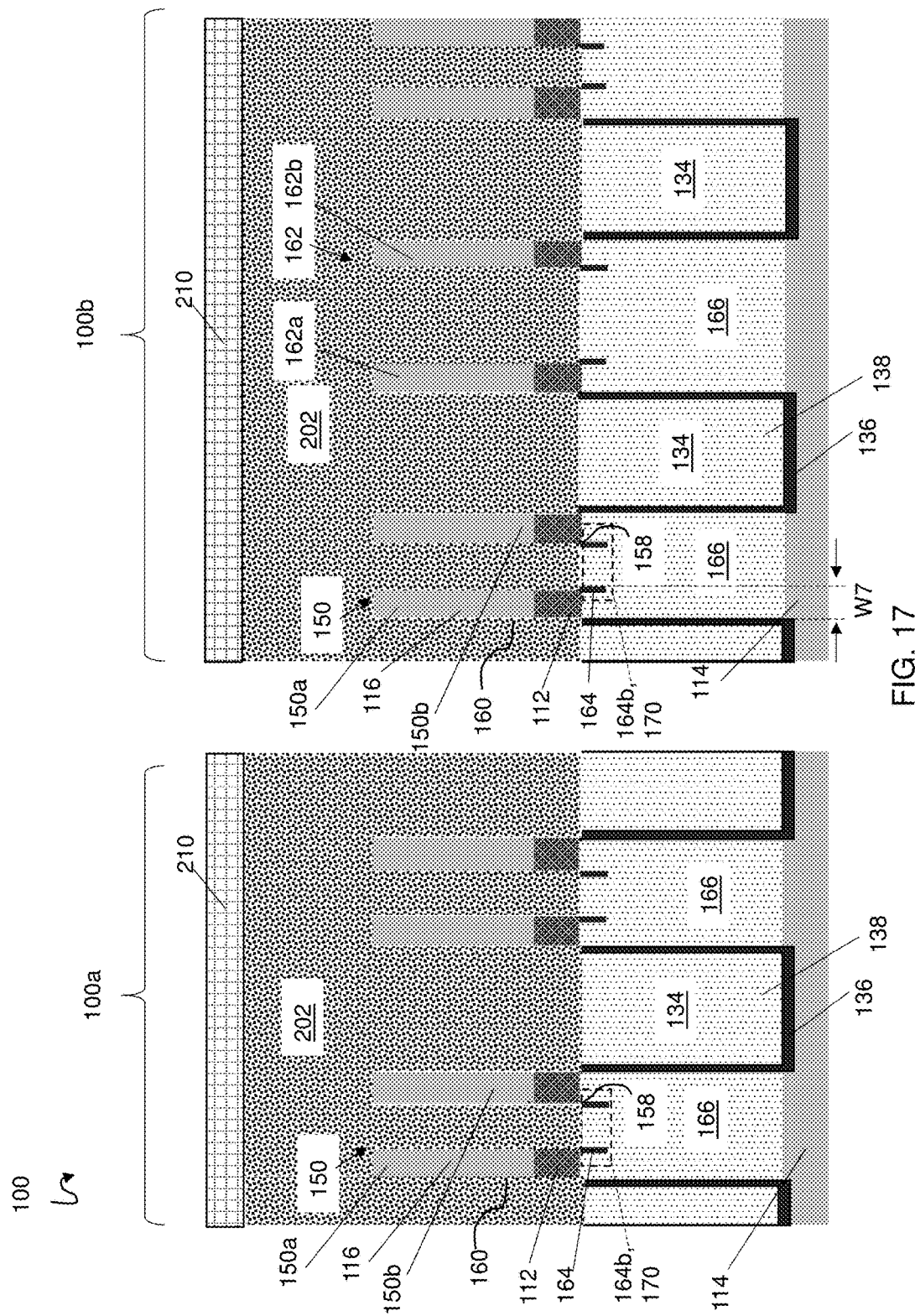
Figure 18:
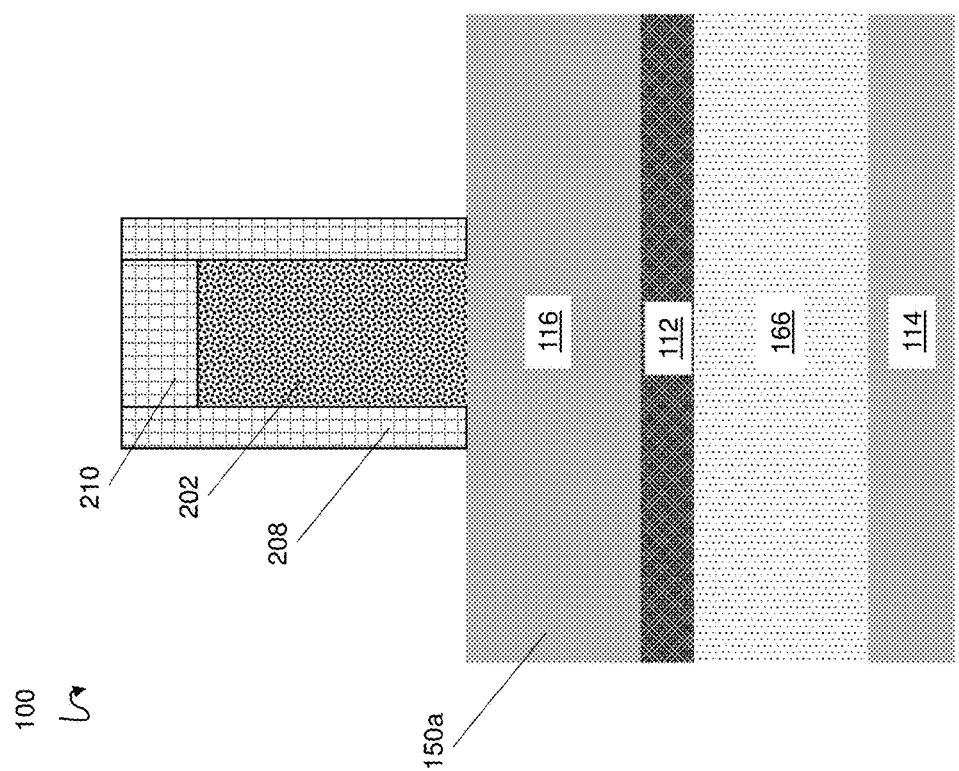

Starting with FIGS. 17 and 18, a dummy gate structure 202 and a spacer 208 may be formed perpendicular to and substantially surrounding an axial portion of each fin 150a, 150b, 162a, 162b. As known in the art, dummy gate structure 202 may be formed in the place of and prior to the formation of an active, final gate structure (not shown in FIG. 17 or 18, but described elsewhere therein). In this way, dummy gate structure 202 allows for IC structure 100 to undergo additional processing without harming the final gate structure. Dummy gate structure 202 may include conventional dummy gate structure materials, such as a thin layer of silicon oxide ($SiO_2$) and polysilicon thereover. Spacer 208 may include any conventional gate spacer material, e.g., silicon nitride or silicon oxide, SiBCN, SiCO, SiOCN, etc. A gate hard mask 210 may be formed over dummy gate structure 202 and spacer 208, and may include, e.g., silicon nitride (SiN), or combination of silicon nitride (SiN) and silicon oxide ($SiO_2$). Dummy gate structure 202, spacer 208, and gate hard mask 210 may be formed by conventional deposition and etching techniques. Dummy gate structure 202 may be formed such that dummy gate structure 202 substantially surrounds an axial portion of the each fin 150a, 150b. Spacer 208 may be formed such that spacer 208 lines opposing sidewalls of dummy gate structure 202. That is, spacer 208 may be formed along opposing sidewalls of dummy gate structure.

Figure 19:
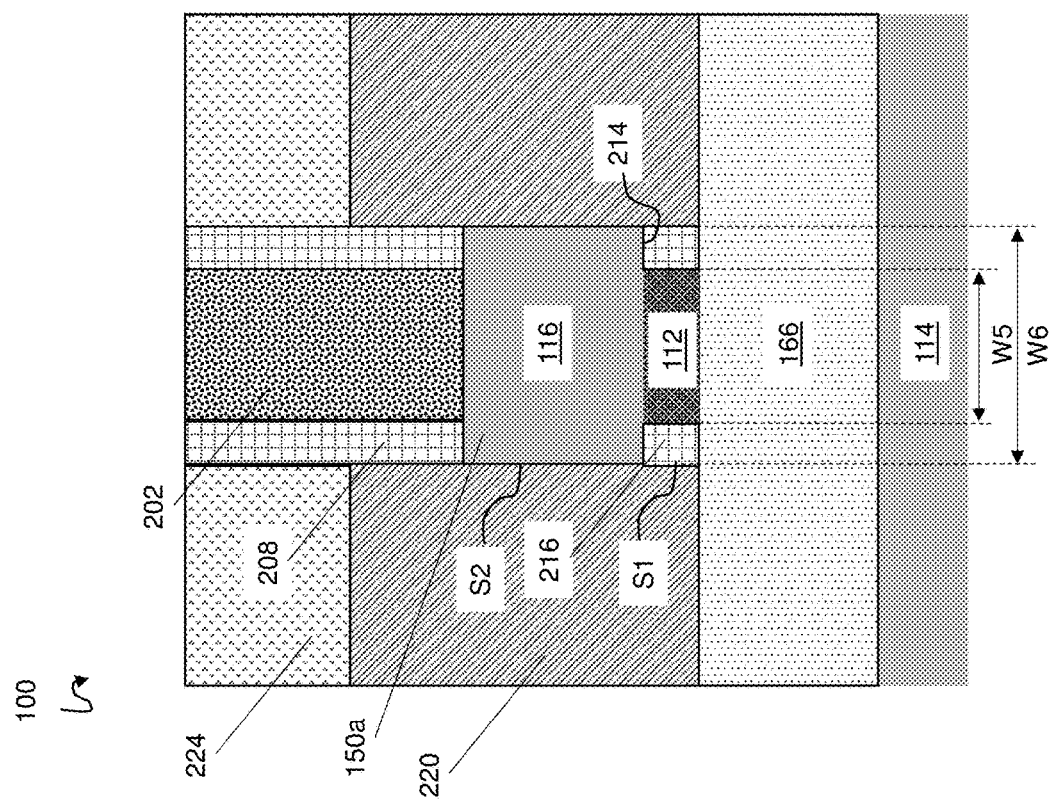

Turning now to FIG. 19, each fin 150a, 150b, 162a, 162b within each pair of fins 150 may be etched using dummy gate 202 and spacer 208 as a mask such that fins 150a, 150b, 162a, 162b are substantially laterally aligned with spacers 208. More specifically, semiconductor layers 112, 116 may each be etched such that semiconductor layers 112, 116 are each substantially laterally aligned with spacers 208 thereby exposing portions of insulator 166 thereunder. In addition, a recessing, e.g., via etching, may be performed to laterally recess semiconductor layer 112 further selective to semiconductor layer 116 thereby forming an undercut 214 beneath semiconductor layer 116. This undercut 214 may be formed, e.g., by an isotropic etching using wet etch or dry etch. In this way, semiconductor layer 112 may have a cross-sectional width W5 of the cross-section taken along fin 150a that is less than a cross-sectional width W6 of semiconductor layer 116 of the cross-sectional view taken along fin 150a. The cross-sectional width W7 (FIG. 17) of fin 150a of the cross-section taken along dummy gate structure 208 may be unchanged.

Undercut 214 may be filled with another spacer 216. Spacer 216 may include any spacer material discussed herein, such as the spacer material used for spacer 208. Spacer 216 may be deposited and etched such that spacer 216 substantially fills undercut 214. In addition, spacer 216 may be etched such that a sidewall 51 of spacer 216 is substantially coplanar with a sidewall S2 of semiconductor layer 116 of each fin 150a, 150b, 162a, 162b. That is, spacers 216 may be formed laterally adjacent to semiconductor layer 112 and between semiconductor material 116 and insulator 166. More specifically, spacers 216 may be formed on opposing sides of semiconductor material 112 in the cross-section taken along fin 150a as shown in FIG. 19.

Still referring to FIG. 19, source/drain epitaxial regions 220 may be formed over insulator 166 and laterally abutting recessed fins 150a, 150b, 162a, 162b. Source/drain epitaxial regions 220 may be formed, for example, by epitaxial growth on opposing sides of each fin 150a, 150b, 162a, 162b. Source/drain epitaxial regions 220 may include, for example, at least one of: silicon, silicon carbon, and/or silicon germanium. Source/drain epitaxial regions 220 may be doped with at least one of: a p-type or an n-type dopant.

The terms "epitaxial growth and/or deposition" and "epitaxially formed and/or grown" mean the growth of a semiconductor material on a deposition surface of a semiconductor material, in which the semiconductor material being grown may have the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it may be formed. For example, an epitaxial semiconductor material deposited on a {100} crystal surface may take on a {100} orientation. In some embodiments, epitaxial growth and/or deposition processes may be selective to forming on semiconductor surfaces, and may not deposit material on dielectric surfaces, such as silicon dioxide or silicon nitride surfaces.

Figure 20:
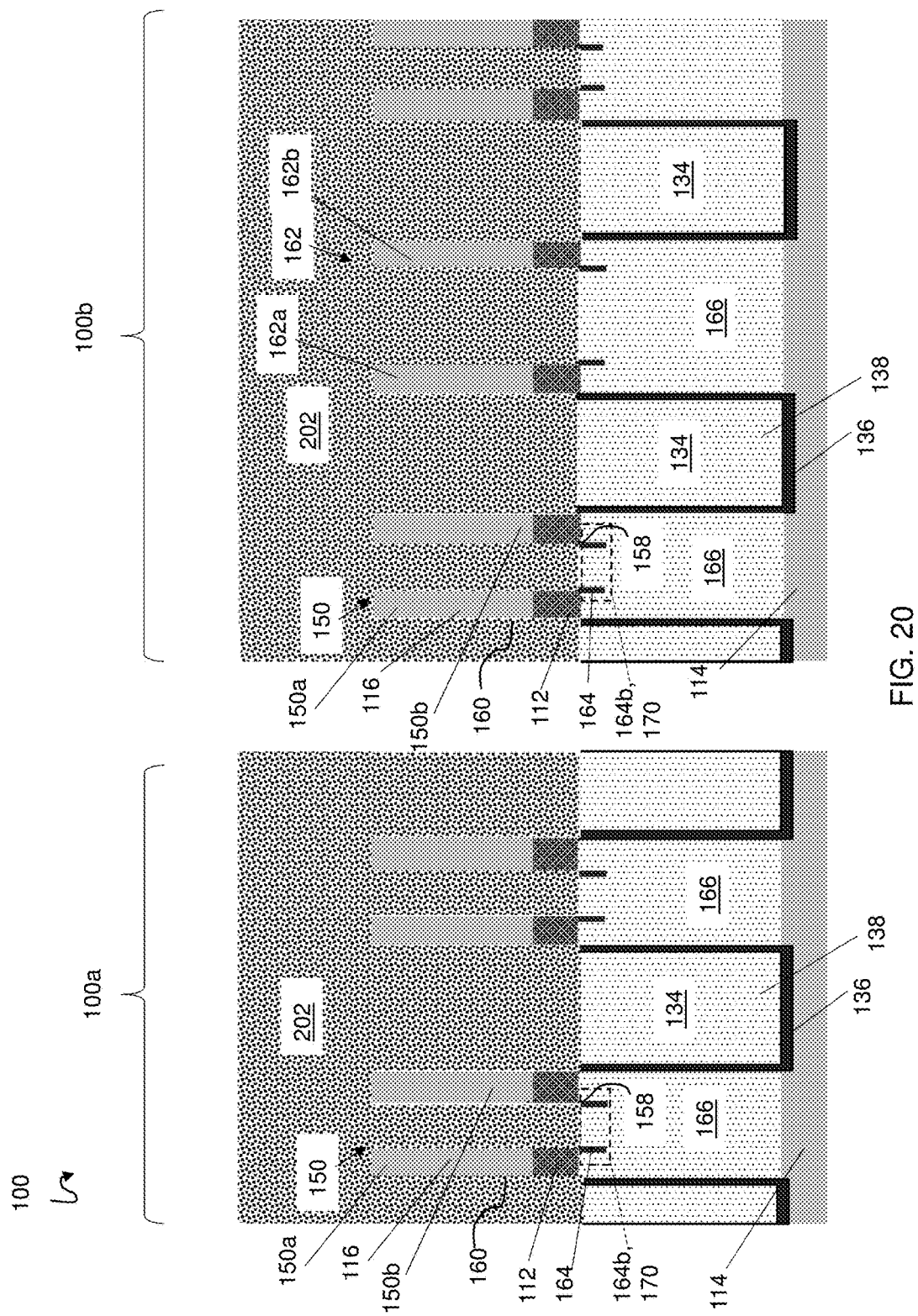

In addition, a dielectric 224 may be formed over source/drain epitaxial regions 220. Dielectric 224 may include any conventional interlayer dielectric material such as, for example at least one of: silicon nitride ($Si_3N_4$), silicon oxide ($SiO_2$), fluorinated SiO2 (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof. Dielectric 224 may be formed by conventional deposition techniques. Further, as shown in FIGS. 19-20, dielectric 224, gate hard mask 210, and spacer 208 may be planarized to a top surface of dummy gate structure 202 such that dummy gate structure 202 is exposed therein. Planarization refers to various processes that make a surface more planar (that is, more flat and/or smooth). Chemical-mechanical-polishing (CMP) is one currently conventional planarization process which planarizes surfaces with a combination of chemical reactions and mechanical forces. Other currently conventional planarization techniques may include: (i) oxidation; (ii) chemical etching; (iii) taper control by ion implant damage; (iv) deposition of films of low-melting point glass; (v) resputtering of deposited films to smooth them out; (vi) photosensitive polyimide (PSPI) films; (vii) new resins; (viii) low-viscosity liquid epoxies; (ix) spin-on glass (SOG) materials; and/or (x) sacrificial etch-back.

Figure 21:
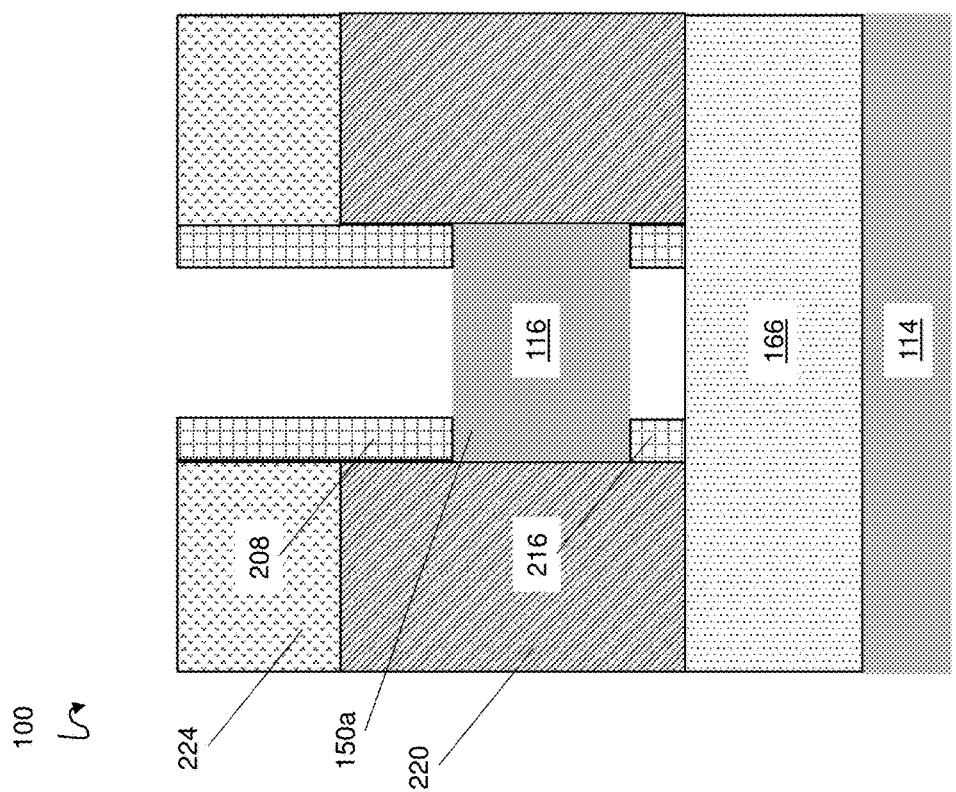
Figure 22:
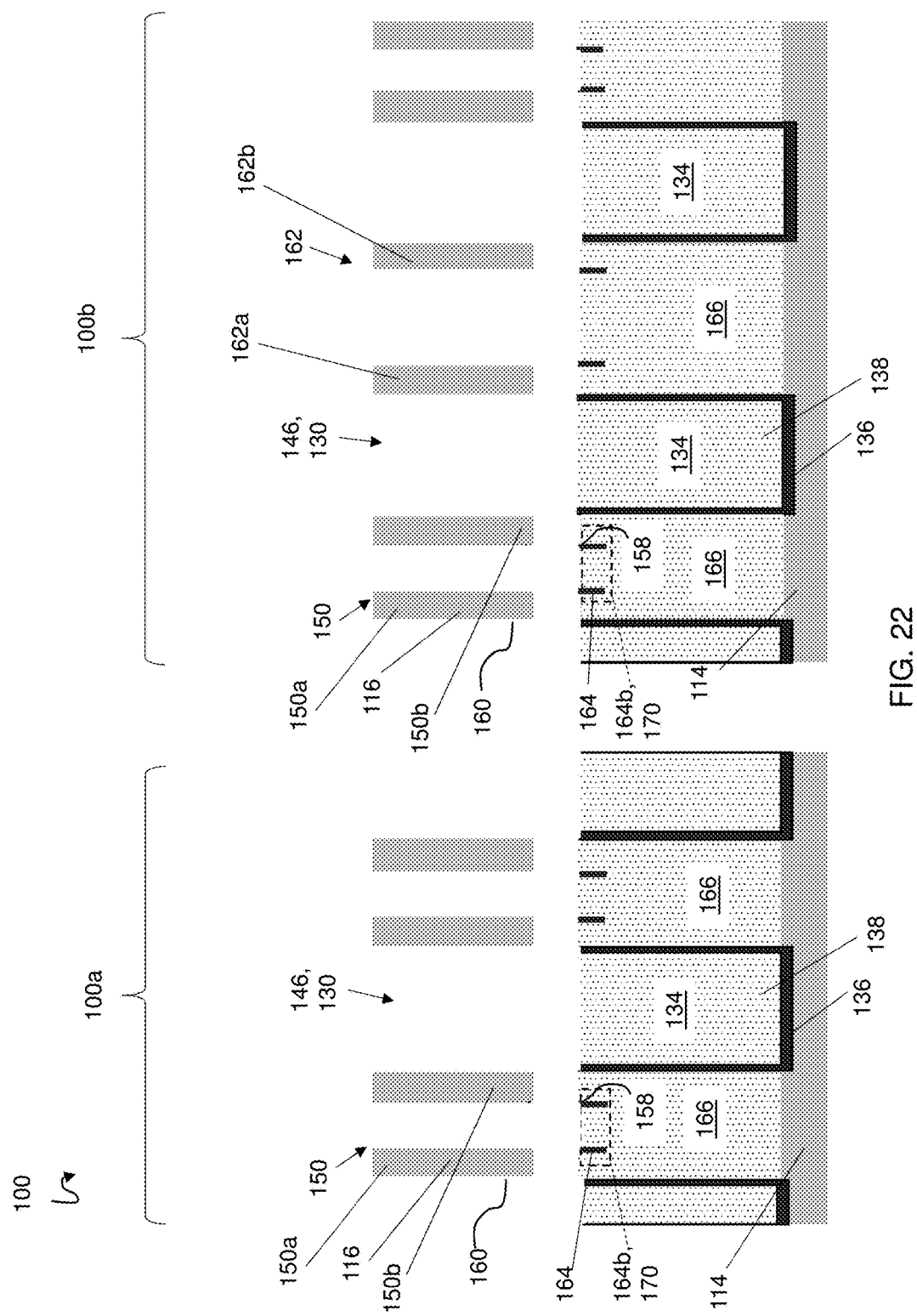

Turning now to FIGS. 21-22, dummy gate structure 202 and semiconductor layer 112 may each be removed, e.g., via etching, to expose semiconductor layer 116 of fins 150a, 150b, 162a, 16b between spacers 208. In this way, semiconductor layer 116 may remain supported by spacers 216 and sandwiched between source/drain epitaxial regions 220. Semiconductor layer 116 may be vertically spaced from insulator 166.

Figure 23:
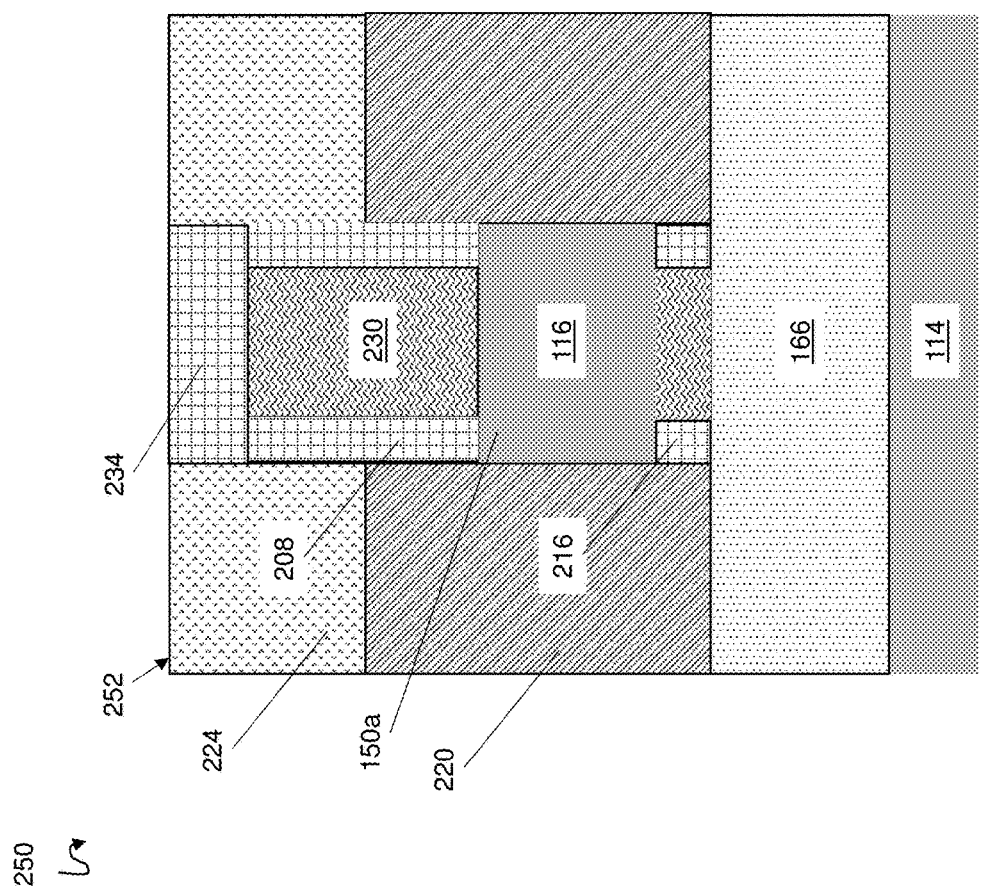
Figure 24:
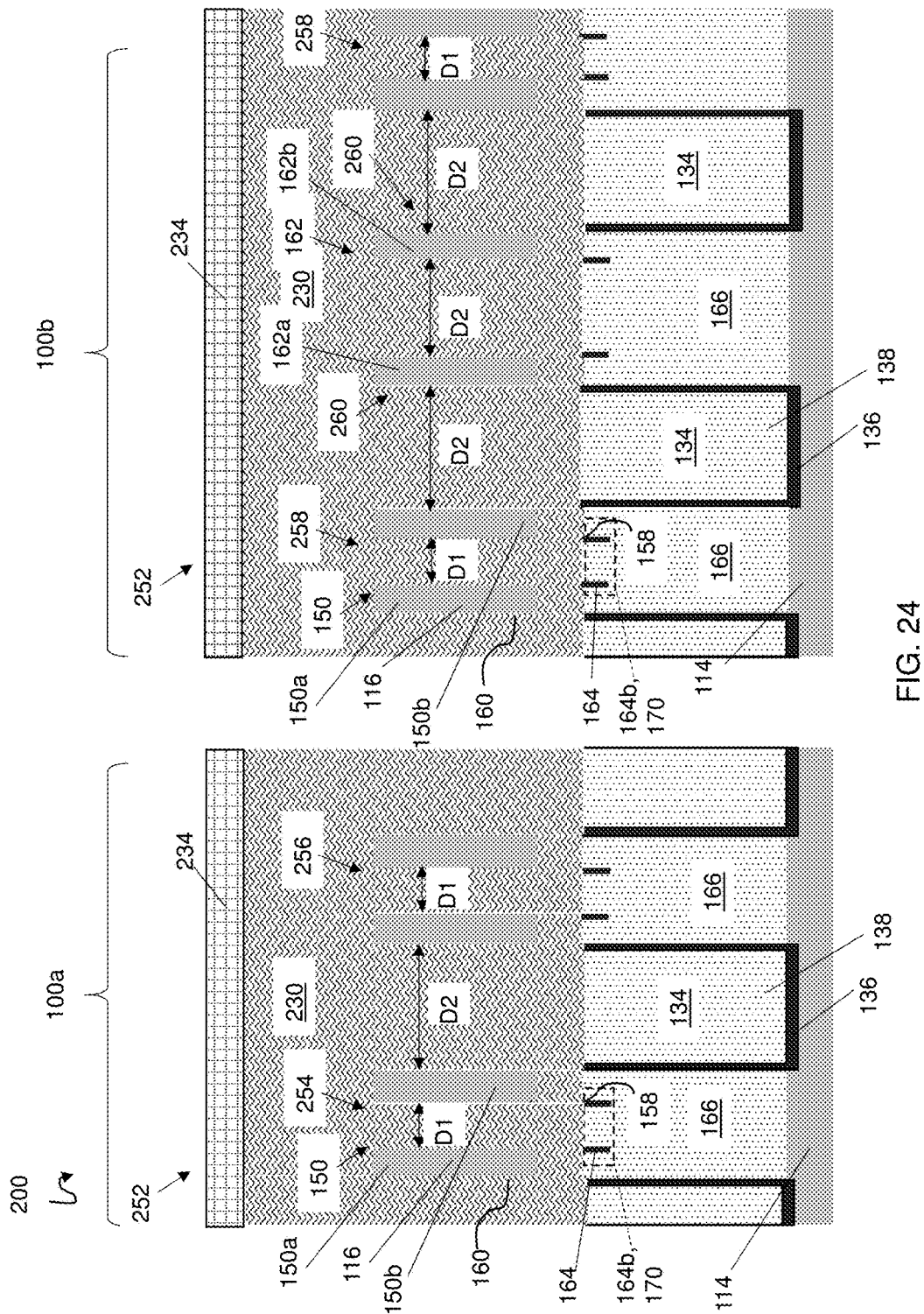

As shown in FIGS. 23-24, an active or replacement gate structure 230 may be formed between spacers 208 and substantially surrounding an axial portion of each fin 150a, 150b, 162a, 162b. While shown as a single layer, it is to be understood that active gate structure 230 may include more than one layer. For example, active gate structure 230 may include a gate dielectric layer, e.g., a layer having a high-dielectric constant (a high-k layer), barrier layers, work function metal layers, and a gate conductor. As known in the art, high-k layers may include, for example, silicon dioxide ($SiO_2$), silicon nitride (SiN), hafnium oxide ($HfO_2$), alumina ($Al_2O_3$), yttrium oxide ($Y_2O_3$), tantalum oxide ($Ta_2O_5$), titanium dioxide ($TiO_2$), praseodymium oxide ($Pr_2O_3$), zirconium oxide ($ZrO_2$), erbium oxide (ErOx), and other currently known or later developed materials having similar properties. Work function metal layers may act as a doping source, and a different work function setting metal can then be employed depending on whether a NFET or a PFET device is desired. Thus, the same gate conductor can be used in each of the devices, yet a different (if so desired) work function setting metal can be used in one or more devices to obtain a different doping polarity. By way of example only, suitable work function setting metals for use in PFET devices include, but are not limited to aluminum, dysprosium, gadolinium, and ytterbium. Suitable work function setting metals for use in NFET devices include, but are not limited to lanthanum, titanium, and tantalum. Optional barrier layers may include, for example, titanium nitride, tantalum nitride, hafnium nitride, hafnium silicon nitride, titanium silicon nitride, tantalum silicon nitride, tungsten nitrogen carbide, and hafnium aluminum nitride. Gate conductor layers may include, for example, at least one of: titanium, titanium nitride, tungsten, tungsten nitride, copper, copper nitride, tantalum, or tantalum nitride. Active gate structure 230 may be formed by conventional deposition and planarization techniques as known in the art. In addition, a gate cap layer 234 may be formed over active gate structure 230 within dielectric 334. Gate cap layer 234 may include, e.g., the same material as is used for spacer 208, such as silicon oxide or silicon nitride.

FIGS. 23 and 24 show a resulting IC structure 250 according to embodiments of the disclosure. Resulting IC structure 250 may include a gate all-around IC structure 252 in both a logic region, e.g., device region 100a, and a SRAM region, e.g., device region 100b, that is laterally adjacent to the logic region. Device or login region 100a may include, for example, one or more double-fin pFETs 254 (FIG. 24) laterally adjacent to one or more double-fin nFETs 256 (FIG. 24). Device or SRAM region 100b may include, for example, one or more double-fin nFETs 258 (FIG. 24) and one or more single-fin pFETs 260. In the example shown in FIG. 24, two double-fin nFETs 258 are shown and two single-fin pFETs 260 are shown within SRAM device region 100b. Each device, i.e., pFETs 254, 260 and nFETs 256, 258 may be separated by larger distances than the distances that separate fins 150a, 150b, 162a, 162b within the same device. For example, distance D1 between fin 150a and fin 150b within pFET 254, nFET 256, and nFETs 258 may be about 14 nanometers to about 20 nanometers. Distance D2 between adjacent devices (e.g., between pFET 254 and nFET 256, between nFETs 258 and pFETs 260, and between pFETs 260) may be about 30 nanometers to about 100 nanometers. It is to be understood that the number of single and/or double-fin pFETs and nFETs described herein is provided merely as an example, and any number of single- and/or double-fin pFETs and nFETs may be provided depending on the application and desired final structure.

Gate all-around IC structures 252 may each include insulator region 166 within substrate 114. A pair of remnant liner stubs 170 may be disposed within insulator region 166. Each remnant liner stub 164b may extend from a top surface of insulator region 166 at least partially into insulator region 166. Gate all-around IC structures 252 may each include insulator region 134 laterally adjacent to and substantially coplanar with insulator region 166 within substrate 114. Insulator region 134 may include dielectric liner 136 and dielectric fill 138. Dielectric liner 136 may be interposed between dielectric fill 138 and insulator region 166. Gate all-around IC structures 252 may each include pair of fins 150, 162 over insulator region 166. Each fin 150a, 150b, 162a, 162b in pair of fins 150, 162 may include inner sidewall 158 facing inner sidewall 158 of an adjacent fin 150a, 150b, 162a, 162b in each pair of fins 150, 162 and outer sidewall 160 opposite inner sidewall 158. Gate all-around IC structures 252 may each include active gate structure 230 substantially surrounding an axial portion of each fin 150a, 150b, 162a, 162b in pair of fins 150, 162 and may be at least partially disposed over insulator regions 134, 166. Gate all-around IC structures 252 may each include source/drain epitaxial regions 220 (FIG. 22) on opposing sides of active gate structure 230 and laterally abutting each fin 150a, 150b, 162a, 162b in pair of fins 150, 162. Further, gate spacer 208 may substantially surround active gate structure 230 and be interposed between gate structure 230 and source/drain epitaxial regions 220. In addition, dielectric 224 (FIG. 22) may be disposed over source/drain epitaxial regions 220, and gate cap layer 234 may be disposed within dielectric 224 over active gate structure 230. Isolation region 166 may extend laterally beneath each fins 150a, 150b, 162a, 162b within each pair of fins 150, 162. Each remnant liner stub 170 may be substantially aligned with inner sidewall 158 of a respective fin 150a, 150b, 162a, 162b of each pair of fins 150, 162. Dielectric liner 136 of insulator region 134 may be substantially aligned with outer sidewall 160 of each fin 150a, 150b, 162a, 162b in pair of fins 150, 162.

Figure 25:
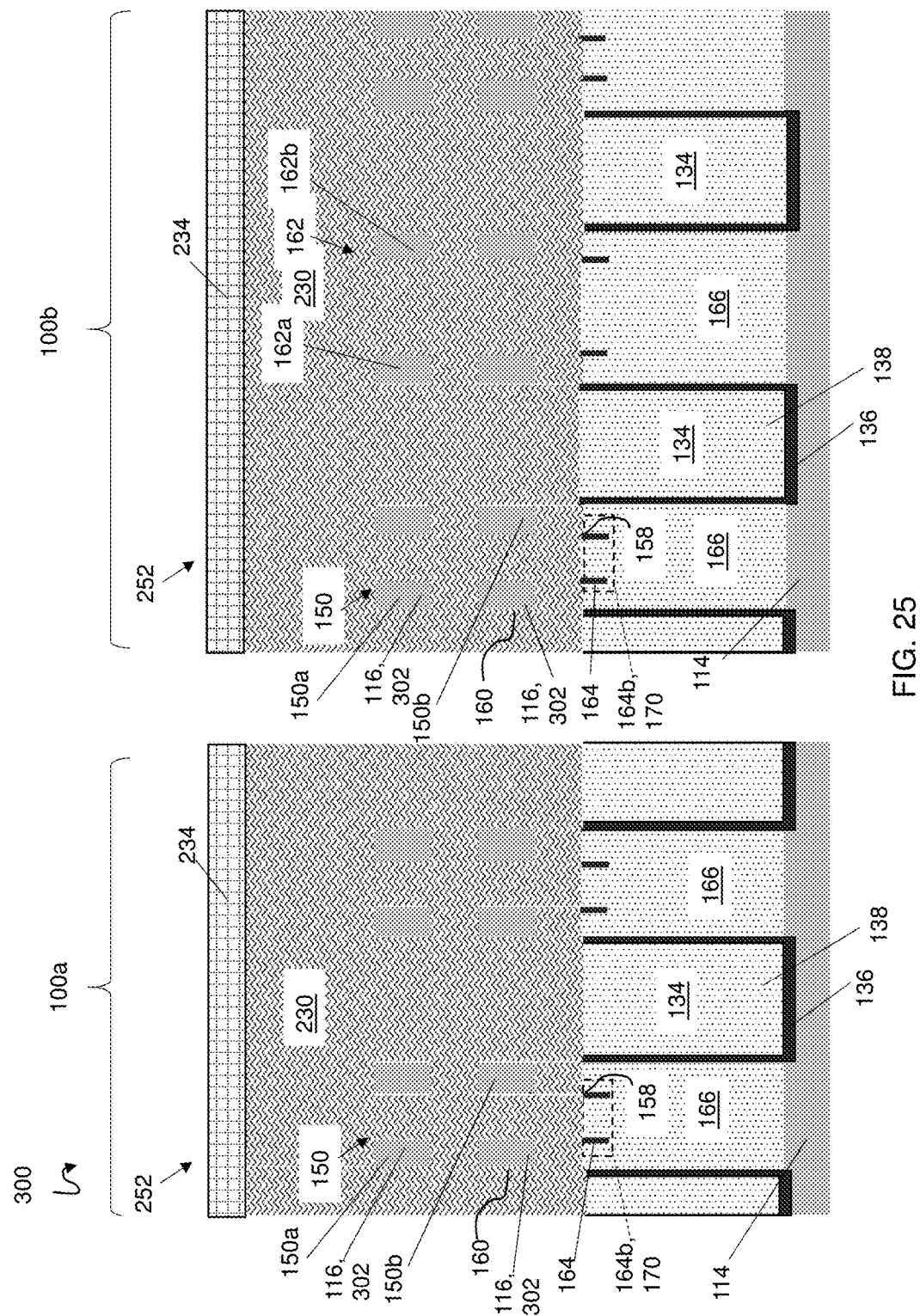
Figure 26:
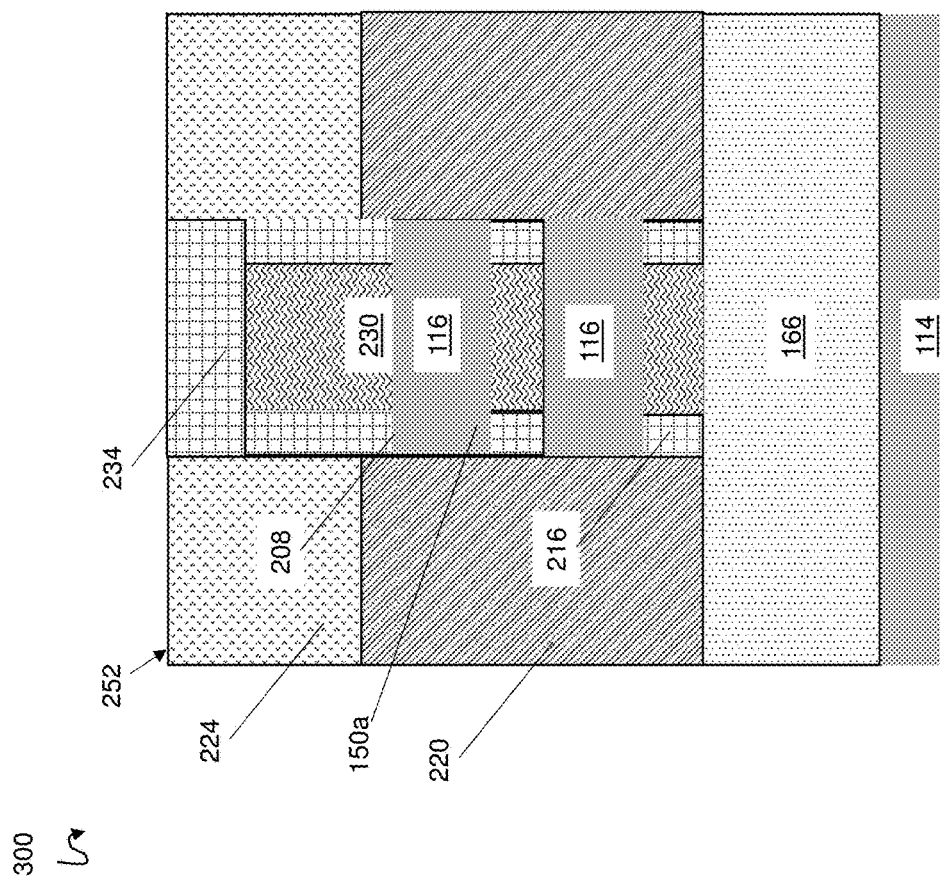
Figure 27:
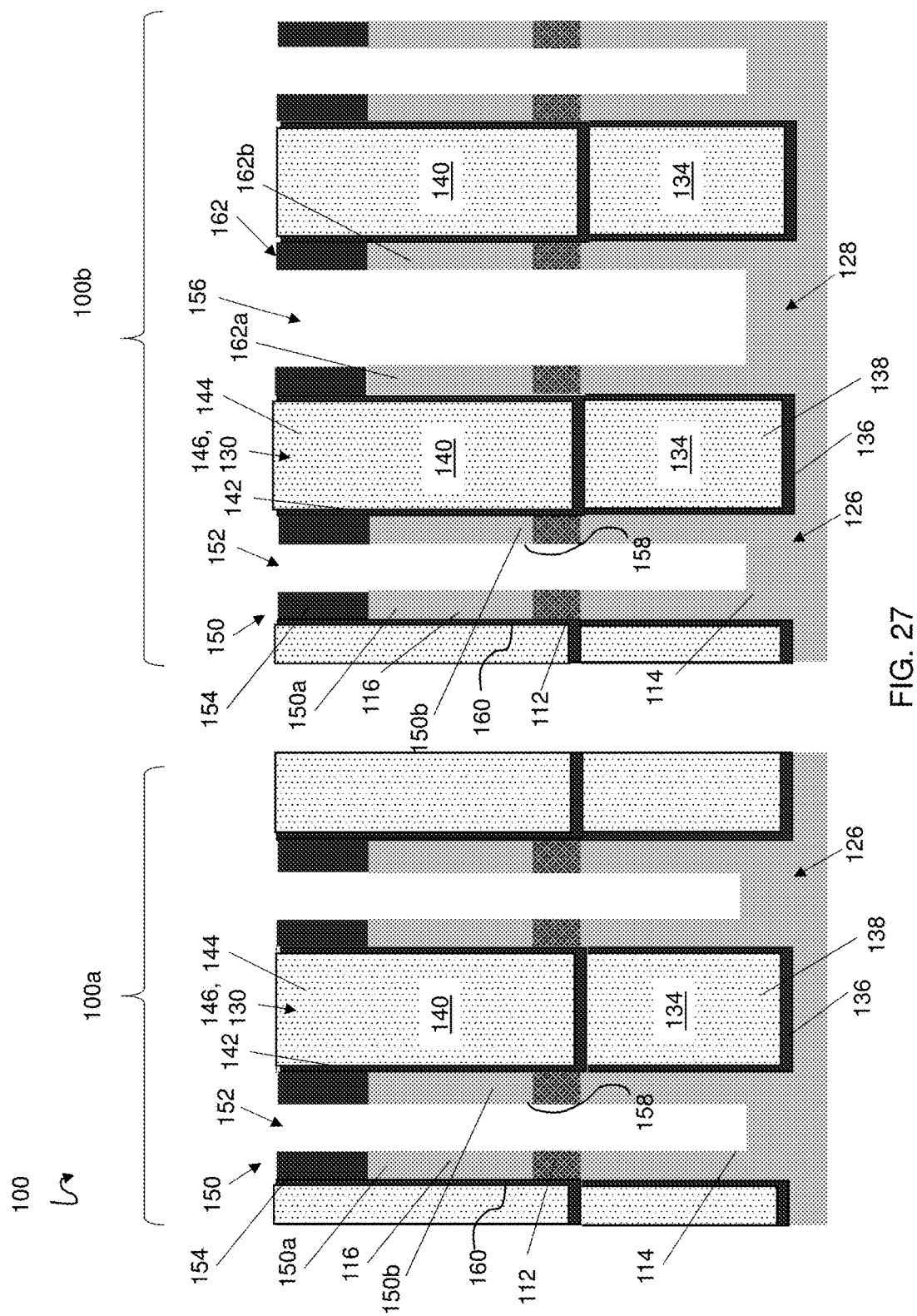
FIGS. 27-30 show cross-sectional views of an integrated circuit structure undergoing aspects of a method for forming fins and an insulator region according to another embodiment of the disclosure.

FIGS. 25-26 show another IC structure 300 according to another embodiment of the disclosure in which each fin 150a, 150b, 162a, 162b in each pair of fins 150, 162 includes a set of vertically spaced nano-ellipses or nanowires 302, wherein an axial portion of each vertically spaced nano-ellipse 302 is substantially surrounded by active gate structure 230. In this embodiment, first semiconductor layer 112 and second semiconductor layer 116 of preliminary IC structure 100 of FIG. 3 may include a set of alternating first and second semiconductor layers 112, 116, one on top of the other. In this embodiment, when semiconductor layer 112 is recessed as was discussed relative to FIG. 19, and when semiconductor layer 112 is removed as was discussed relative to FIGS. 21 and 22, each alternating layer of semiconductor layer 112 may be recessed and removed, respectively. In addition, spacer 216 may be formed laterally adjacent each recessed semiconductor layer 112 as described relative to FIG. 19. As a result, resulting IC structure 300 according to this embodiment is substantially the same as that of FIGS. 23-24, however, fins 150a, 150b, 162a, 162b each include more than one vertically spaced nano-ellipse or nanowire 302 comprising semiconductor layer 116 such that fins 150a, 150b, 162a, 162b may be considered gate all-around segmented fins. As used herein, a nano-ellipse may refer to a nanosheet extending in a vertical direction. While only two vertically spaced nano-ellipses 302 are shown, it is to be understood that any number of vertically spaced nano-ellipses 302 can be included without departing from aspects of the disclosure.

Figure 28:
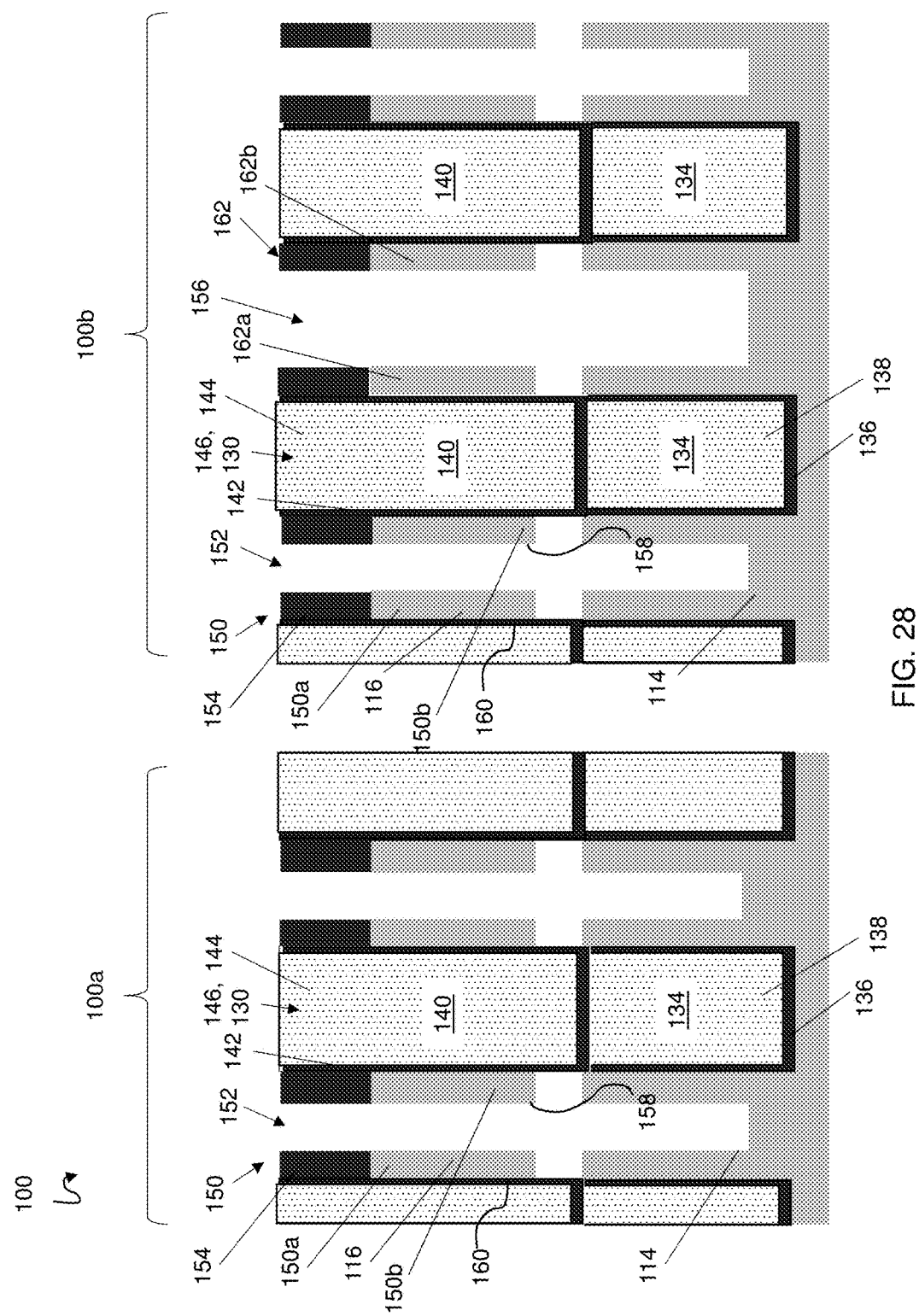

FIGS. 27-32 show another embodiment of the disclosure. In this embodiment, during the etching of openings 152, 156 to form fins 150a, 150b, 162a, 162b from pillars 126, 128 as described relative to FIG. 10, openings 152, 156 may be etched deeper in substrate 114 than was done in the embodiment of FIG. 10. For example, in this embodiment a total of about 20 nm to about 80 nm may be etched within semiconductor layers 112, 116 and substrate 114, whereas in the embodiment of FIG. 10, a total of less than about 20 nm may be etched into semiconductor layers 112, 116 and substrate 114. In addition, prior to the formation of liner 164 (FIG. 11), semiconductor layer 112 may be removed from fins 150a, 150b, 162a, 162b such that semiconductor layer 116 is vertically spaced from substrate 114 as shown in FIG. 28. In this way, openings 152, 156 are laterally expanded and opening 152, 156 extends into an area between substrate 114 and semiconductor layer 116.

Figure 29:
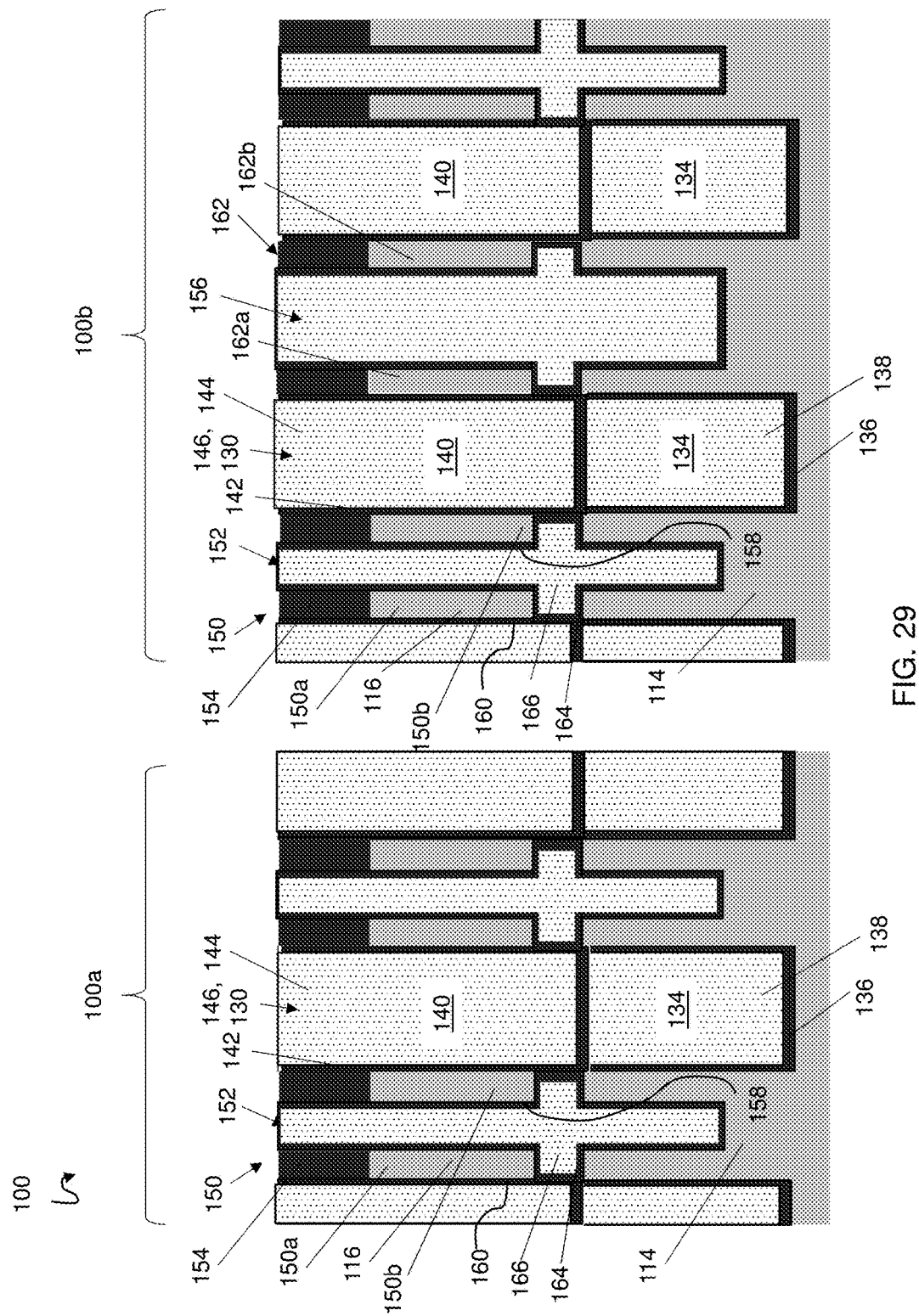

Subsequently, as shown in FIG. 29, liner 164 may be conformally formed, e.g., via deposition, within each opening 152, 156 along inner sidewalls 158 of each fin 150a, 150b, 162a, 162b. In addition, each opening 152, 156 may be filled, e.g., via deposition, with insulator 166 such that insulator 166 is formed over liner 164 to fill openings 152, 156. In this way, liner 164 and insulator 166 are formed between the vertically spaced substrate 114 and semiconductor layer 116.

Figure 30:
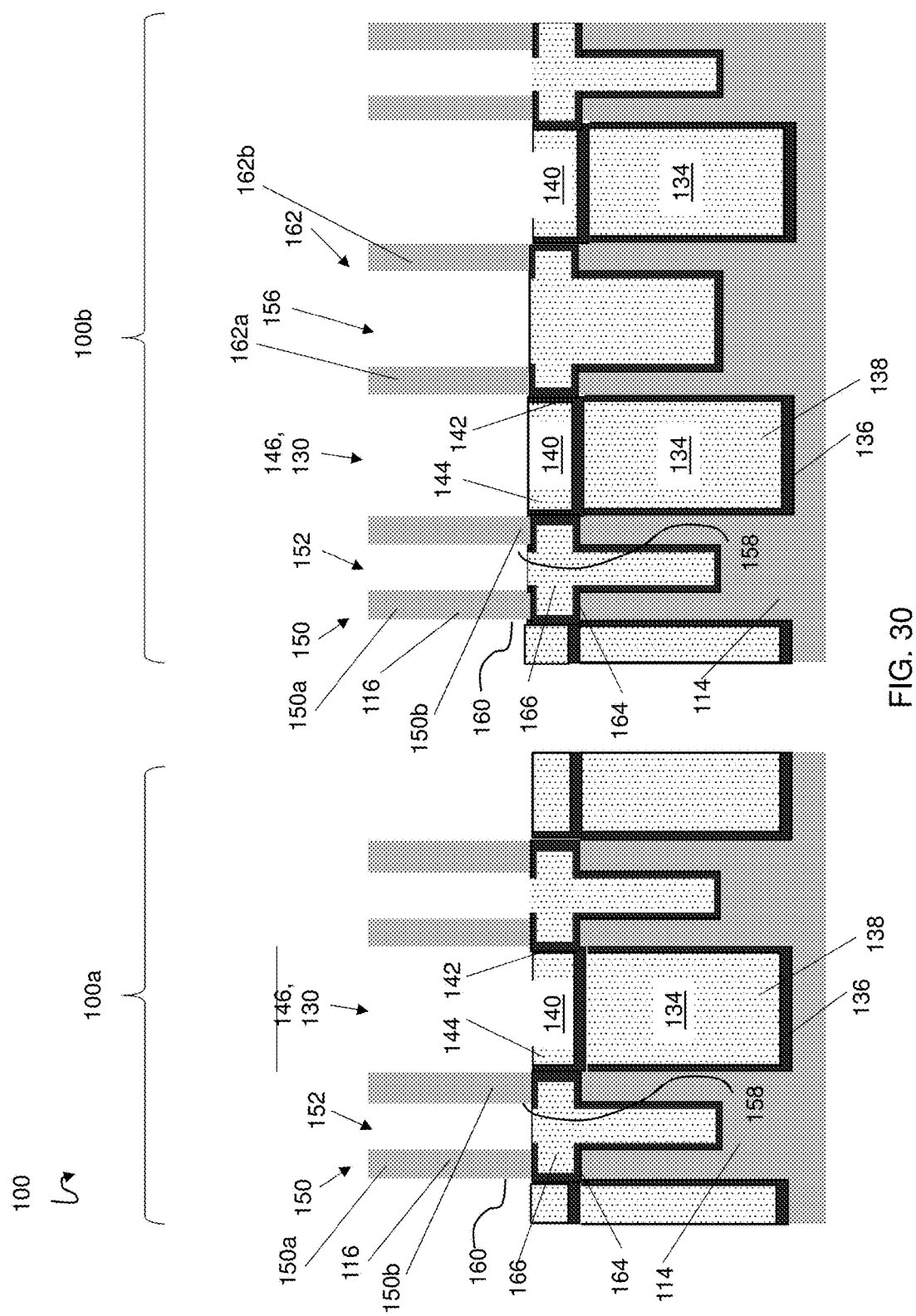

Turning now to FIG. 30, the method according to this embodiment may continue with the recessing, e.g., via etching, of insulator region 146. More specifically, the upper portion of insulator region 146 including dielectric fill 144 may be recessed as was described herein relative to FIG. 13. During this recessing, portions of insulator 166 may also be recessed between fins 150a, 150b, 162a, 162b as was discussed herein relative to FIG. 13. Subsequently, another etching may be performed to recess insulator 166 between fins 150a, 150b, 162a, 162b to a position substantially coplanar with insulator region 146 as was discussed relative to FIG. 14. Further, exposed portions of dielectric liner 142 and liner 164 may also be removed as shown in FIG. 30 to expose fins 150a, 150b, 162a, 162b. As shown in FIG. 30, dielectric fill 144, insulator 166, and liners 164, 142 may be recessed to a position proximate or substantially coplanar with a bottom surface of second semiconductor layer 116 of each fin 150a, 150b, 162a, 162b.

Figure 31:
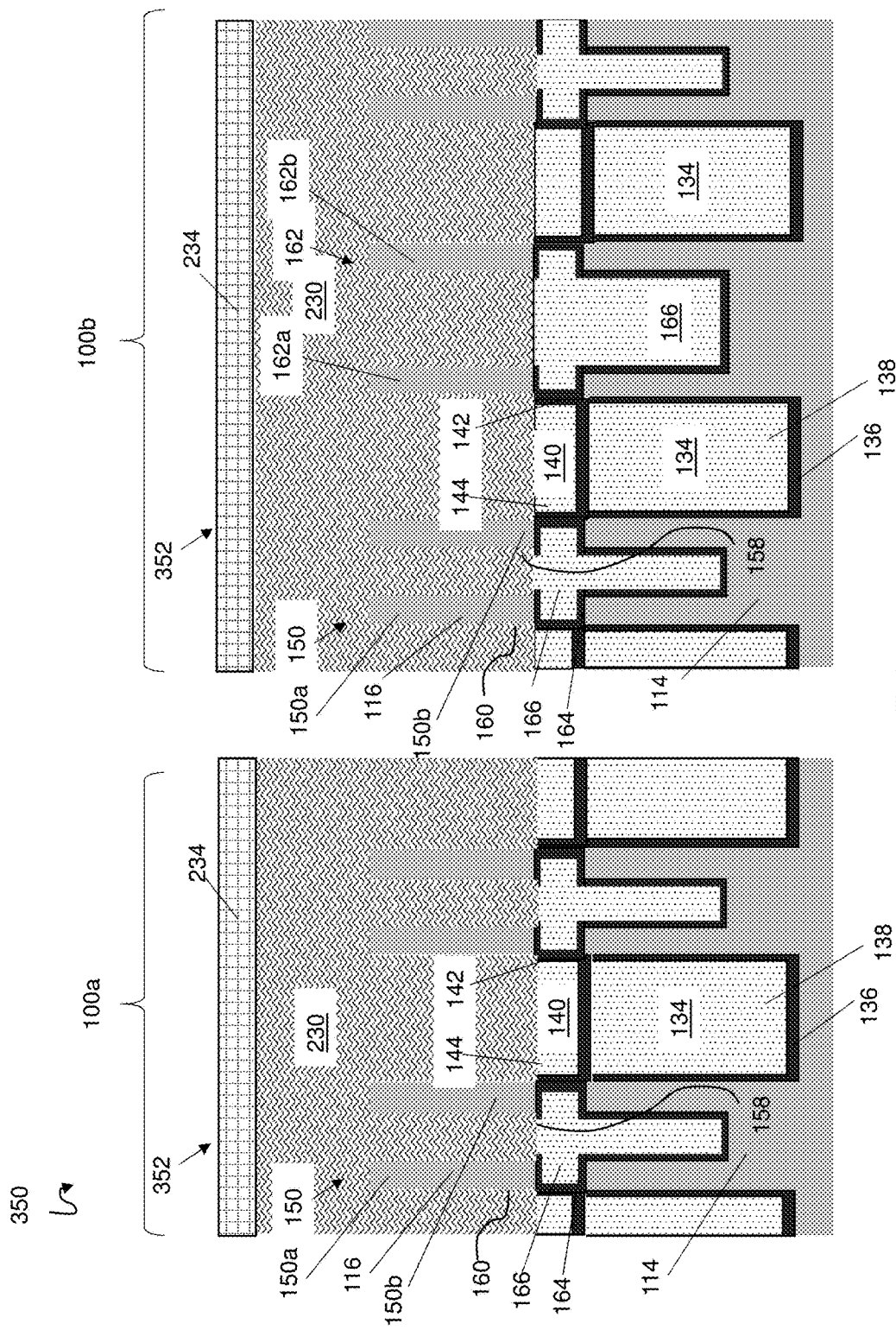
Figure 32:
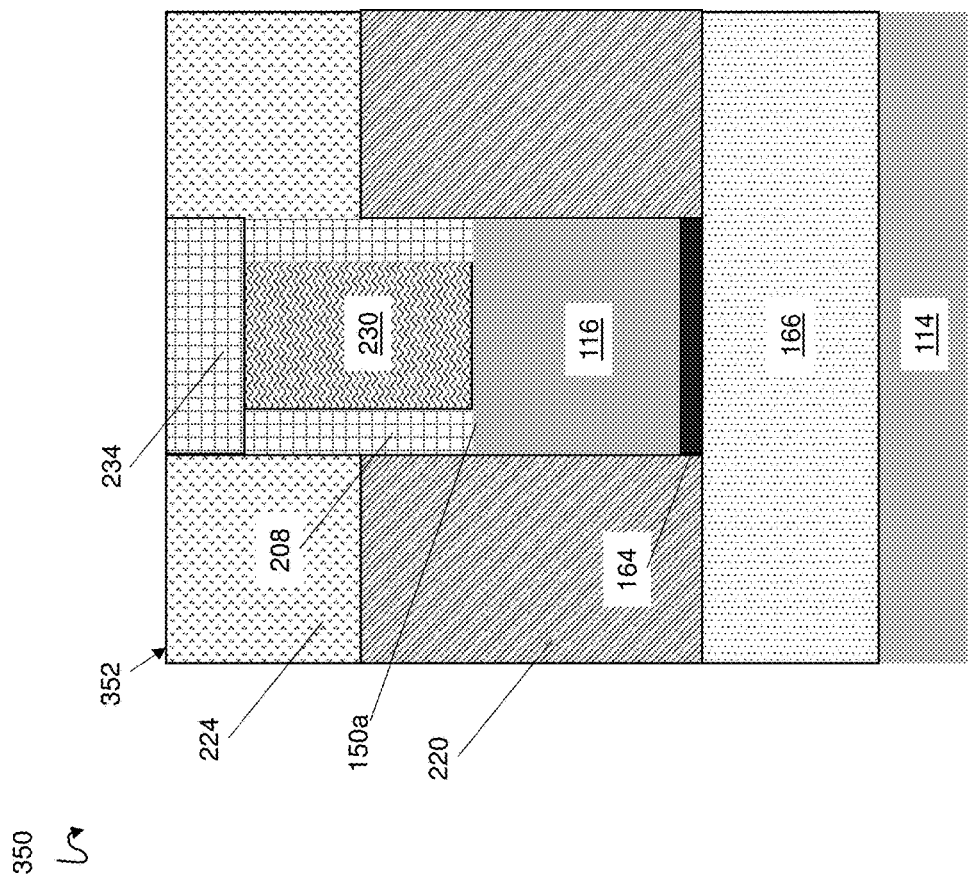
Figure 33:
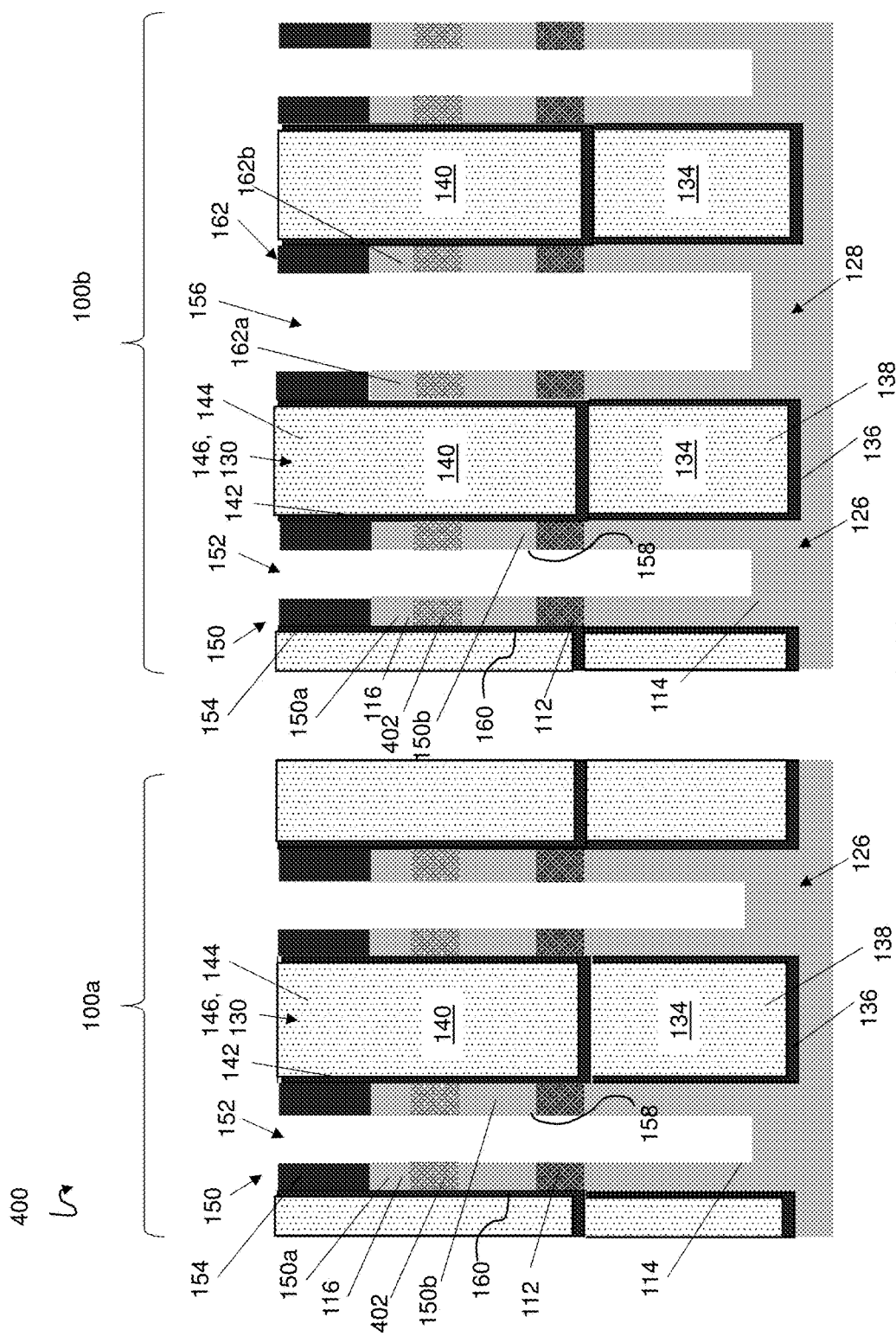
FIGS. 33-36 show cross-sectional views of an integrated circuit structure undergoing aspects of a method for forming fins and an insulator region according to another embodiment of the disclosure.

Turning now to FIGS. 31-32, the method according to this embodiment may continue with the formation of source/drain epitaxial regions 220 and active gate structure 230 as was described herein relative to FIGS. 17-24. However, since semiconductor layer 112 was removed prior to the formation of liner 164 as was described relative to FIG. 28, when dummy gate structure 202 is removed as was described relative to FIGS. 21-22, there is no need to remove any semiconductor layer 112. Therefore, the method according to this embodiment may continue by forming dummy gate structure 202 such that dummy gate structure 202 substantially surrounds an axial portion of each fin 150a, 150b, 162a, 162b; forming gate spacers 208 over each fin 150a, 150b, 162a, 162b on opposing sides of dummy gate structure 202 and forming gate hard mask 210 over dummy gate structure 202 and spacers 208; etching each fin 150a, 150b, 162a, 162b using dummy gate 202 and spacers 208 as a mask; forming source/drain epitaxial regions 220 laterally abutting and on opposing sides of each fin 150a, 150b, 162a, 162b; forming a dielectric 224 over source/drain epitaxial regions 220; removing gate hard mask 210 from over spacers 208 and dummy gate structure 202; removing dummy gate structure 202 from between spacers 208; and forming an active gate structure 230 between gate spacers 208 such that active gate structure 230 substantially surrounds semiconductor layer 116 of each fin 150a, 150b, 162a, 162b.

FIGS. 31 and 32 show a resulting IC structure 350 according to embodiments of the disclosure. Resulting IC structure 350 may include an IC structure 352 in both a logic region, e.g., device region 100a, and a SRAM region, e.g., device region 100b. Device regions 100a, 100b may be configured to include pFETs and nFETs as described relative to FIG. 24, but is not included in FIG. 30 for brevity. IC structure 352 of this embodiment may not be considered a gate all-around IC structure since active gate structure 230 is not disposed completely around an axial portion of each fin 150a, 150b, 162a, 162b. Rather, insulator 166 is partially interposed beneath each fin 150a, 150b, 162a, 162b between substrate 114 and semiconductor layer 116 of each fin 150a, 150b, 162a, 162b. In this way, IC structures 352 may actually be considered finFETs with a dielectric isolation.

As shown in FIGS. 31 and 32, IC structure 350 may include pair of fins 150, 162 over substrate 114. Insulator 166 may be interposed between each fin 150a, 150b, 162a, 162b and substrate 114. Insulator 166 may be substantially T-shaped such that insulator region 166 extends laterally from beneath one fin 150a, 162a in pair of fins 150, 162 to another fin 150b, 162b in pair of fins 150, 162 and such that insulator 166 extends vertically at least partially within substrate 114 at a position between fins 150a, 150b, 162a, 162b. IC structure 350 may further include an active gate structure 230 over insulator 166 and substantially surrounding each fin 150a, 150b, 162a, 162b in pair of fins 150, 162. Source/drain epitaxial regions 220 (FIG. 32) may be disposed on opposing sides of gate structure 230 and laterally abutting each fin 150a, 150b, 162a, 162b in pair of fins 150, 162.

FIGS. 33-38 show yet another embodiment of the disclosure. This embodiment may be substantially similar to the embodiment described relative to FIGS. 27-32. However, each fin 150a, 150b, 162a, 162b in IC structure 400 shown in FIG. 33 may include alternating semiconductor layers 112, 116, 402 over substrate 114. Semiconductor layers 112, 116 and substrate 114 may include any of the semiconductor layer and substrate materials, respectively, described relative to FIG. 3. However, semiconductor layer 112 according to this embodiment may more specifically include Si50Ge50. Further, semiconductor layer 402 may include, Si65Ge35. Therefore, openings 152, 156 to form fins 150a, 150b, 162a, 162b from pillars 126, 128 as described relative to FIG. 10 may be formed. However, in this embodiment, openings 152, 156 maybe etched into semiconductor layer 402 in addition to substrate 114 and semiconductor layers 112, 116. Like the embodiment of FIGS. 27-32, openings 152, 156 may be etched deeper into substrate 114 than that which was described relative to FIG. 10.

Figure 34:
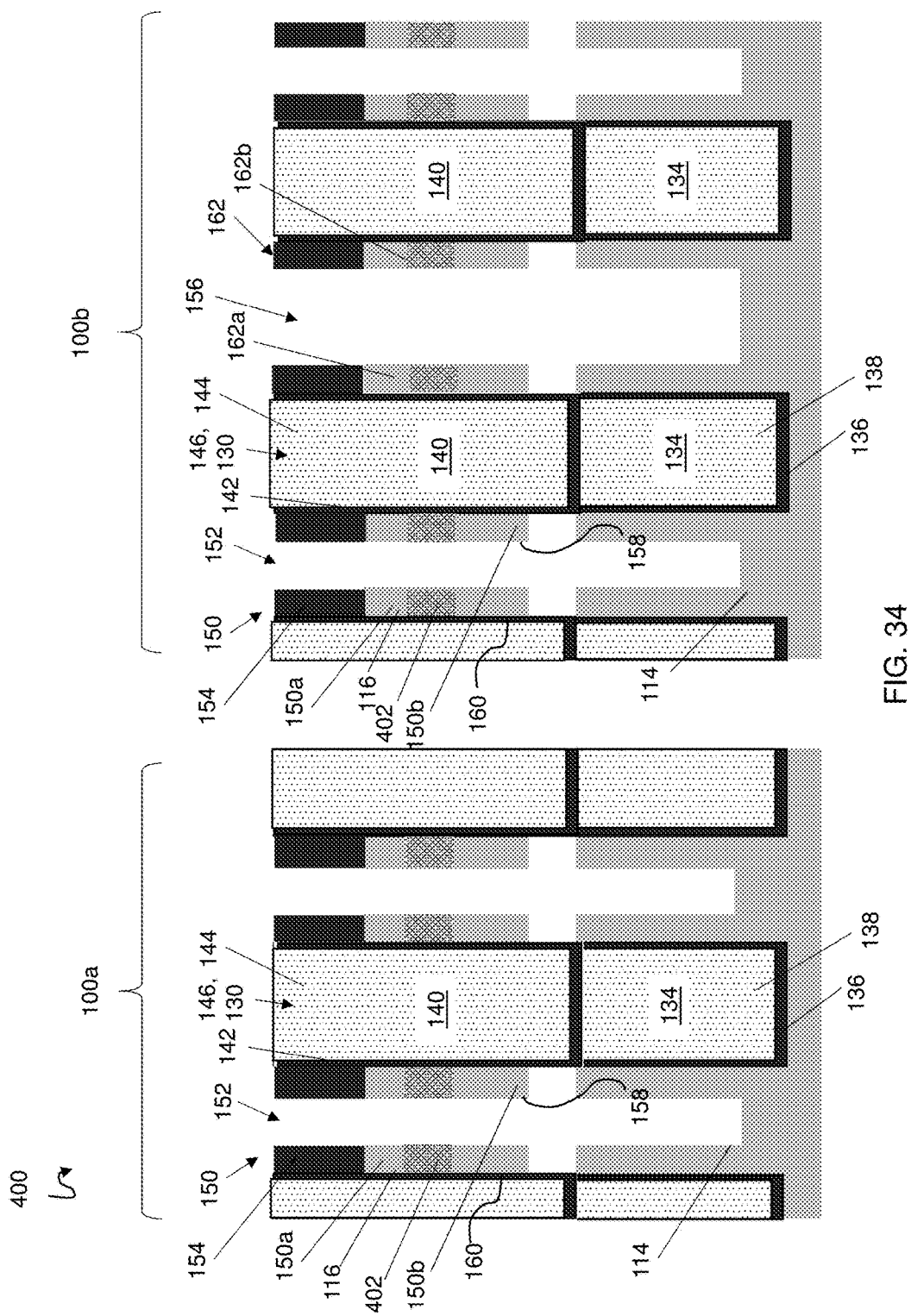

In addition, prior to the formation of liner 164 (FIG. 11), semiconductor layer 112 may be removed from fins 150a, 150b, 162a, 162b such that semiconductor layer 116 is vertically spaced from substrate 114 as shown in FIG. 34. In this way, openings 152, 156 are laterally expanded and opening 152, 156 extends into an area between substrate 114 and semiconductor layer 116.

Figure 35:
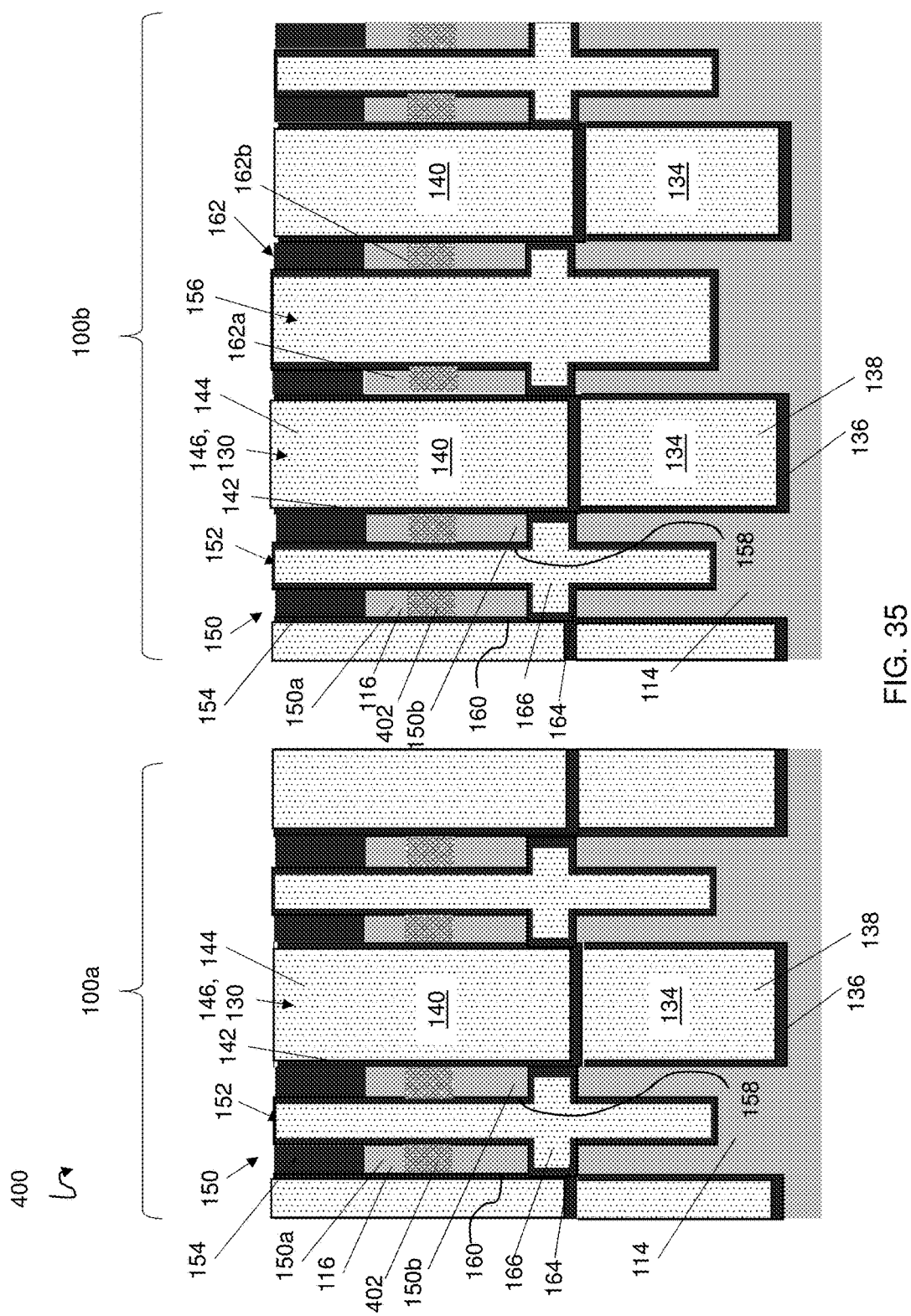

Subsequently, as shown in FIG. 35, liner 164 may be conformally formed, e.g., via deposition, within each opening 152, 156 along inner sidewalls 158 of each fin 150a, 150b, 162a, 162b. In addition, each opening 152, 156 may be filled, e.g., via deposition, with insulator 166 such that insulator 166 is formed over liner 164 to fill openings 152, 156. In this way, liner 164 and insulator 166 are formed between the vertically spaced substrate 114 and semiconductor layer 116.

Figure 36:
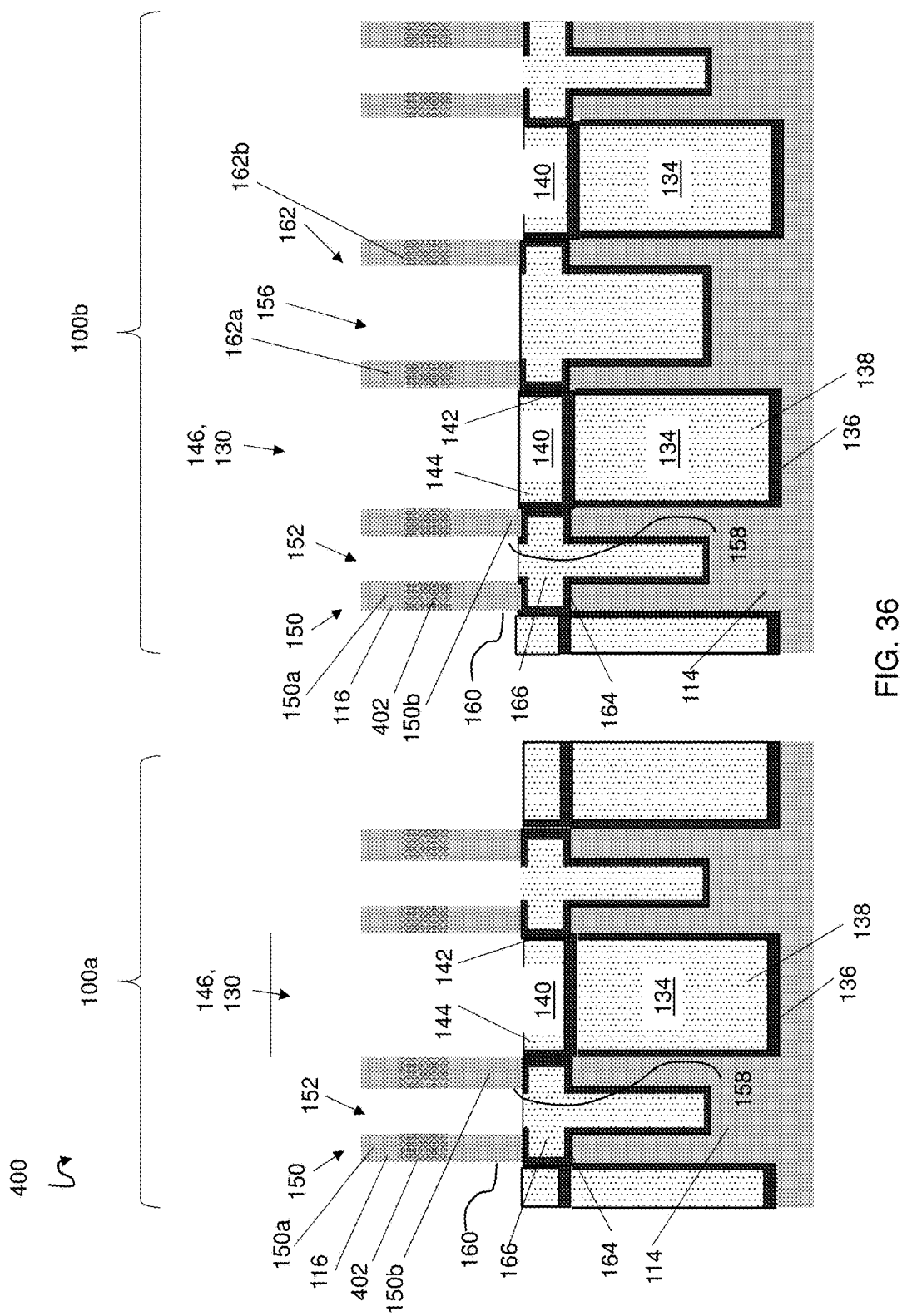

Turning now to FIG. 36, the method according to this embodiment may continue with the recessing, e.g., via etching, of insulator region 146. More specifically, the upper portion of insulator region 146 including dielectric fill 144 may be recessed as was described herein relative to FIG. 13. During this recessing, portions of insulator 166 may also be recessed between fins 150a, 150b, 162a, 162b as was discussed herein relative to FIG. 13. Subsequently, another etching may be performed to recess insulator 166 between fins 150a, 150b, 162a, 162b to a position substantially coplanar with insulator region 146 as was discussed relative to FIG. 14. Further, exposed portions of dielectric liner 142 and liner 164 may also be removed as shown in FIG. 36 to expose fins 150a, 150b, 162a, 162b. As shown in FIG. 36, dielectric fill 144, insulator 166, and liners 164, 142 may be recessed to a position proximate or substantially coplanar with a bottom surface of second semiconductor layer 116 of each fin 150a, 150b, 162a, 162b.

Figure 37:
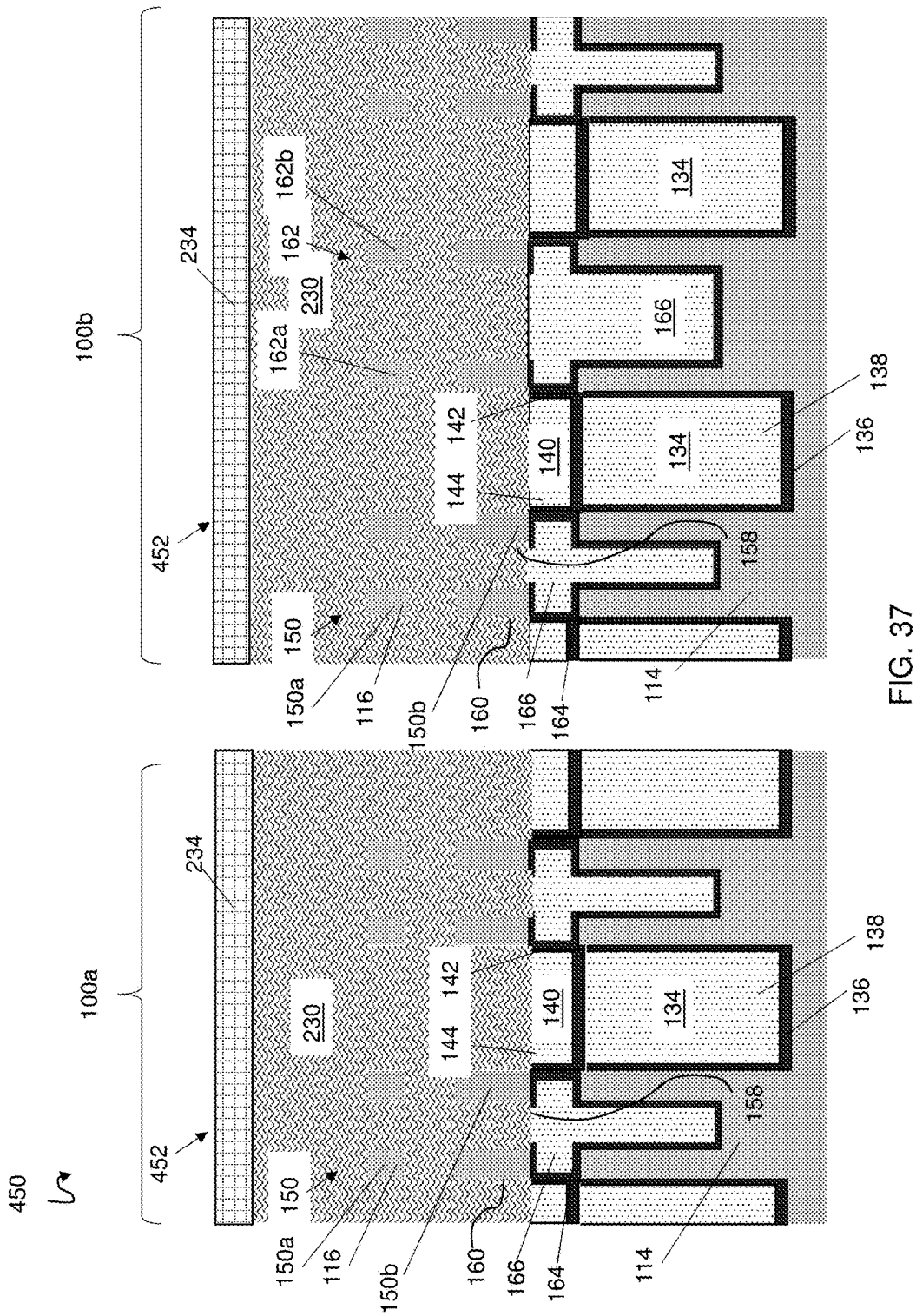
FIG. 37 shows a cross-sectional view of the integrated circuit structure taken along the gate.
Figure 38:
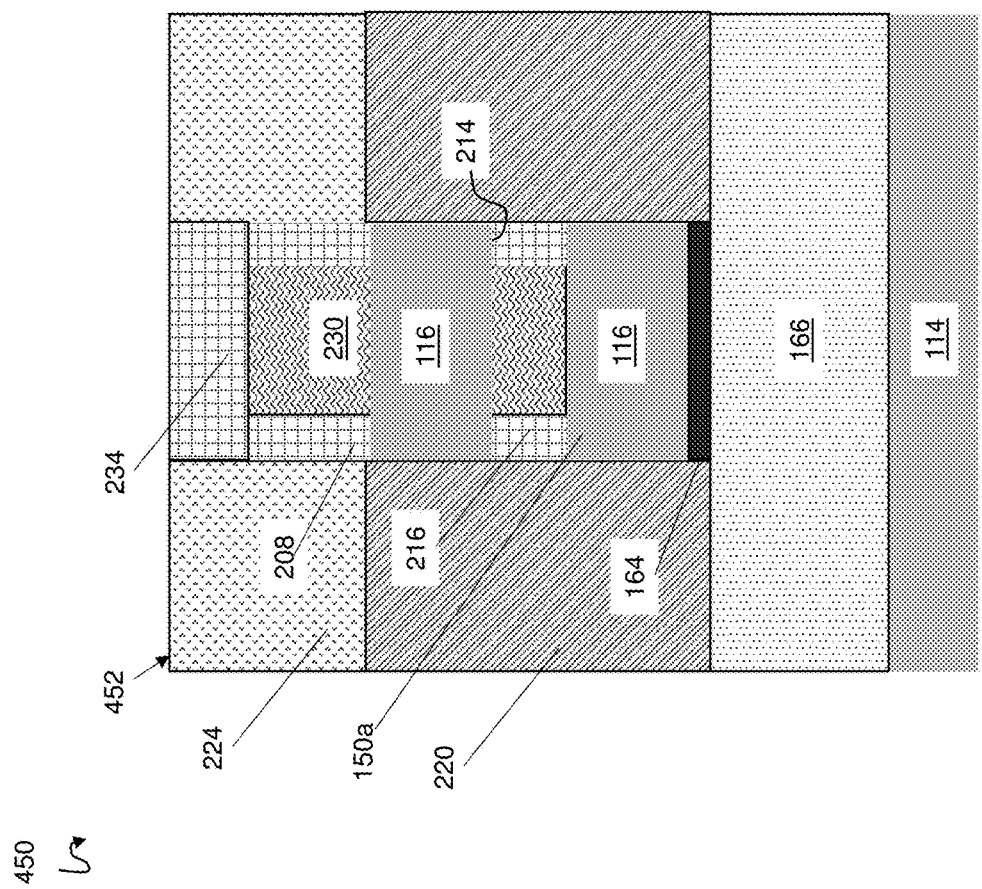
FIG. 38 shows a cross-sectional view of the integrated circuit structure taken along a fin.

Turning now to FIGS. 37-38, the method according to this embodiment may continue with the formation of source/drain epitaxial regions 220 and active gate structure 230 as was described herein relative to FIGS. 17-24. However, since semiconductor layer 112 was removed prior to the formation of liner 164 as was described relative to FIG. 34, when dummy gate structure 202 is removed as was described relative to FIGS. 21-22, there is no need to remove any semiconductor layer 112. However, since semiconductor layer 402 remains within fins 150a, 150b, 162a, 162b, semiconductor layer 402 may be removed instead. Therefore, the method according to this embodiment may continue by forming dummy gate structure 202 such that dummy gate structure 202 substantially surrounds an axial portion of each fin 150a, 150b, 162a, 162b; forming gate spacers 208 over each fin 150a, 150b, 162a, 162b on opposing sides of dummy gate structure 202 and forming gate hard mask 210 over dummy gate structure 202 and spacers 208; etching each fin 150a, 150b, 162a, 162b using dummy gate 202 and spacers 208 as a mask; recessing semiconductor layer 402 to form an undercut 214; forming spacers 216 within undercut 214; forming source/drain epitaxial regions 220 laterally abutting and on opposing sides of each fin 150a, 150b, 162a, 162b; forming a dielectric 224 over source/drain epitaxial regions 220; removing gate hard mask 210 from over spacers 208 and dummy gate structure 202; removing dummy gate structure 202 from between spacers 208; removing semiconductor layer 402 from between spacers 216; and forming an active gate structure 230 between gate spacers 208 and spacer 216 such that active gate structure 230 substantially surrounds semiconductor layer 116 of each fin 150a, 150b, 162a, 162b.

FIGS. 37-38 show a resulting IC structure 450 according to embodiments of the disclosure. Resulting IC structure 450 may include an IC structure 452 in both a logic region, e.g., device region 100a, and a SRAM region, e.g., device region 100b. Device regions 100a, 100b may be configured to include pFETs and nFETs as described relative to FIG. 24, but is not included in FIG. 35 for brevity. IC structure 452 of this embodiment may not be considered a gate all-around IC structure since active gate structure 230 is not disposed completely around an axial portion of each fin 150a, 150b, 162a, 162b. Rather, insulator 166 is partially interposed beneath each fin 150a, 150b, 162a, 162b between substrate 114 and semiconductor layer 116 of each fin 150a, 150b, 162a, 162b. In this way, IC structures 452 may actually be considered finFETs with a dielectric isolation.

As shown in FIG. 37, IC structure 450 may include pair of fins 150, 162 over substrate 114. Fins 150a, 150b, 162a, 162b of pair of fins 150, 162 may be segmented fins having nano-ellipses. Insulator 166 may be interposed between each fin 150a, 150b, 162a, 162b and substrate 114. Insulator 166 may be substantially T-shaped such that insulator region 166 extends laterally from beneath one fin 150a, 162a in pair of fins 150, 162 to another fin 150b, 162b in pair of fins 150, 162 and such that insulator 166 extends vertically at least partially within substrate 114 at a position between fins 150a, 150b, 162a, 162b. IC structure 450 may further include an active gate structure 230 over insulator 166 and substantially surrounding each fin 150a, 150b, 162a, 162b in pair of fins 150, 162. Source/drain epitaxial regions 220 (FIG. 30) may be disposed on opposing sides of gate structure 230 and laterally abutting each fin 150a, 150b, 162a, 162b in pair of fins 150, 162.

The integrated circuit structures described herein do not suffer from non-uniform fin reveal or bending/collapsing of fins which may occur in conventional finFETs or gate all-around integrated circuit structures. The methods described herein provide for a cheaper and less difficult fabrication scheme than that of conventional gate all-around integrated circuit structures.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the terms "first," "second," and the like, do not denote any order, quantity, or importance, but rather are used to distinguish one element from another. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately" and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s). "Substantially" refers to largely, for the most part, entirely specified or any slight deviation which provides the same technical benefits of the disclosure.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A gate all-around integrated circuit structure comprising:
    a first insulator region within a substrate;
    a pair of remnant liner stubs disposed within the first insulator region, wherein each remnant liner stub extends from a top surface of the first insulator region at least partially into the first insulator region;
    a second insulator region laterally adjacent to the first insulator region within the substrate, the second insulator region including a dielectric liner and a dielectric fill, the dielectric liner being interposed between the dielectric fill and the first insulator region;
    a pair of fins over the first insulator region, each fin in the pair of fins including an inner sidewall facing the inner sidewall of an adjacent fin in the pair of fins and an outer sidewall opposite the inner sidewall; and
    a gate structure substantially surrounding an axial portion of the pair of fins and at least partially disposed over the first and second insulator regions,
    wherein each remnant liner stub is substantially aligned with the inner sidewall of a respective fin of the pair of fins.

2. The gate all-around integrated circuit structure of claim 1, wherein the dielectric liner of the second insulator region is substantially aligned with the outer sidewall of each fin in the pair of fins.

3. The gate all around integrated circuit structure of claim 1, wherein the second insulator region is substantially coplanar with the first insulator region.

4. The gate all-around integrated circuit structure of claim 1, further comprising:
    source/drain epitaxial regions on opposing sides of the gate structure and laterally abutting each fin in the pair of fins.

5. The gate all-around integrated circuit structure of claim 4, further comprising:
    a gate spacer substantially surrounding the gate structure and interposed between the gate structure and the source/drain epitaxial regions.

6. The gate all-around integrated circuit structure of claim 1, wherein each fin in the pair of fins includes a gate all-around segmented fin having a set of vertically spaced nano-ellipses, wherein an axial portion of each vertically spaced nano-ellipse is substantially surrounded by the gate structure.

7. The gate all-around integrated circuit structure of claim 1, wherein the first insulator region extends laterally beneath each fin in the pair of fins.

* * * * *